(12) United States Patent
Miyano et al.

(10) Patent No.: US 11,690,208 B2
(45) Date of Patent: Jun. 27, 2023

(54) ELECTROMAGNETIC FIELD SHIELDING PLATE, METHOD FOR MANUFACTURING SAME, ELECTROMAGNETIC FIELD SHIELDING STRUCTURE, AND SEMICONDUCTOR MANUFACTURING ENVIRONMENT

(71) Applicant: Hitachi High-Tech Corporation, Tokyo (JP)

(72) Inventors: Ichiro Miyano, Tokyo (JP); Osamu Komuro, Tokyo (JP); Masakazu Takahashi, Tokyo (JP); Masashi Fujita, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 65 days.

(21) Appl. No.: 17/294,576

(22) PCT Filed: Jan. 15, 2019

(86) PCT No.: PCT/JP2019/000819
§ 371 (c)(1),
(2) Date: May 17, 2021

(87) PCT Pub. No.: WO2020/148796
PCT Pub. Date: Jul. 23, 2020

(65) Prior Publication Data
US 2022/0007556 A1 Jan. 6, 2022

(51) Int. Cl.
*H05K 9/00* (2006.01)
*H01F 1/153* (2006.01)
(Continued)

(52) U.S. Cl.
CPC ............ *H05K 9/0088* (2013.01); *H01J 37/09* (2013.01); *H01F 1/153* (2013.01); *H01J 37/28* (2013.01); *H01L 21/67017* (2013.01)

(58) Field of Classification Search
CPC .............................. H05K 9/0088; H01F 1/153
See application file for complete search history.

(56) References Cited

U.S. PATENT DOCUMENTS

| 4,992,329 A | 2/1991 | Ishii et al. |
| 10,010,018 B2 | 6/2018 | Lee et al. |

(Continued)

FOREIGN PATENT DOCUMENTS

| JP | 58-96295 U | 6/1983 |
| JP | 62-221199 A | 9/1987 |

(Continued)

OTHER PUBLICATIONS

International Search Report (PCT/ISA/210) issued in PCT Application No. PCT/JP2019/000819 dated Apr. 23, 2019 with English translation (six (6) pages).

(Continued)

*Primary Examiner* — Hung V Ngo
(74) *Attorney, Agent, or Firm* — Crowell & Moring LLP

(57) ABSTRACT

Provided is an electromagnetic field shielding plate, etc., in which it is possible to reduce weight while achieving high shielding performance from relatively high-frequency electromagnetic fields. The electromagnetic field shielding plate is configured by layering a permalloy layer 3 comprising a plate or sheet of permalloy, and an amorphous layer 1 comprising an Fe—Si—B—Cu—Nb-based amorphous plate or sheet.

27 Claims, 18 Drawing Sheets

(51) Int. Cl.
*H01J 37/09* (2006.01)
*H01J 37/28* (2006.01)
*H01L 21/67* (2006.01)

(56) References Cited

U.S. PATENT DOCUMENTS

| | | | |
|---|---|---|---|
| 10,123,467 B2 | 11/2018 | Lee et al. | |
| 2007/0029110 A1* | 2/2007 | Matsumoto | E04B 2/824 |
| | | | 174/353 |
| 2008/0180308 A1* | 7/2008 | Okada | H01Q 17/00 |
| | | | 428/411.1 |
| 2010/0276193 A1* | 11/2010 | Liu | H05K 9/0075 |
| | | | 174/353 |
| 2014/0077612 A1* | 3/2014 | Onuma | G01R 33/025 |
| | | | 307/91 |
| 2015/0027771 A1 | 1/2015 | Kagawa | |
| 2015/0060131 A1 | 3/2015 | Coppola | |
| 2015/0123604 A1 | 5/2015 | Lee et al. | |
| 2015/0200048 A1* | 7/2015 | Han | H01F 1/047 |
| | | | 336/200 |
| 2016/0007510 A1 | 1/2016 | Cheng | |
| 2018/0359885 A1* | 12/2018 | Woo | H01Q 17/004 |
| 2020/0045859 A1* | 2/2020 | Kagawa | B32B 15/16 |

FOREIGN PATENT DOCUMENTS

| | | |
|---|---|---|
| JP | 2-101598 U | 8/1990 |
| JP | 4-83396 A | 3/1992 |
| JP | 4-266092 A | 9/1992 |
| JP | 5-291779 A | 11/1993 |
| JP | 6-2789 U | 1/1994 |
| JP | 7-58479 A | 3/1995 |
| JP | 7-231191 A | 8/1995 |
| JP | 2606971 B2 | 5/1997 |
| JP | 10-145077 A | 5/1998 |
| JP | 2837595 B2 | 12/1998 |
| JP | 11-26981 A | 1/1999 |
| JP | 2000-306971 | 11/2000 |
| JP | 2000-328691 A | 11/2000 |
| JP | 2007-295557 A | 11/2007 |
| JP | 2007-299923 A | 11/2007 |
| JP | 2007-329150 A | 12/2007 |
| JP | 2015-505166 A | 2/2015 |
| KR | 10-2013-0072181 A | 7/2013 |
| TW | 201338692 A | 9/2013 |
| TW | 201512346 A | 4/2015 |
| TW | 201601915 A | 1/2016 |

OTHER PUBLICATIONS

Japanese-language Written Opinion (PCT/ISA/237) issued in PCT Application No. PCT/JP2019/000819 dated Apr. 23, 2019 (nine (9) pages).

Korean-language Office Action issued in Korean Application No. 10-2021-7014439 dated Jun. 23, 2022 (seven (7) pages).

Taiwanese-language Office Action issued in Taiwanese Application No. 109101345 dated Jun. 28, 2021 (four (4) pages).

Chinese-language Office Action issued in Chinese Application No. 201980075606.2 dated Apr. 26, 2023 (12 pages).

\* cited by examiner (CROSS SECTION TAKEN ON LINE A-A)

(ENLARGED VIEW SECTION A)

(ENLARGED VIEW SECTION B)

(ENLARGED VIEW SECTION A)

(ENLARGED VIEW SECTION B)

(ENLARGED VIEW SECTION C)

ELECTROMAGNETIC FIELD SHIELDING PLATE, METHOD FOR MANUFACTURING SAME, ELECTROMAGNETIC FIELD SHIELDING STRUCTURE, AND SEMICONDUCTOR MANUFACTURING ENVIRONMENT

TECHNICAL FIELD

The present invention relates to: an electromagnetic field shielding plate; its manufacturing method; an electromagnetic field shielding structure; and a semiconductor manufacturing environment.

BACKGROUND ART

A length CD-SEM or shape observation and various dimensional measurements of an element circuit pattern over a wafer using an electron microscope is widely used as a measurement/inspection device for process quality control in semiconductor manufacturing. Following the higher integration of semiconductor devices, has been required to obtain observation of finer shapes (a wiring width or diameter of around 10 nm to 20 nm) and high-precision and high-resolution measurement results for an actual shape with good repeatability.

Meanwhile, in recent semiconductor manufacturing, a three-dimensional structure of stacking a plurality of layers, each of which is a layer of a structural unit in which semiconductor circuits are formed, with metal electrodes, etc. conducting electricity between layers interposed has been adopted in order to: avoid performance limits due to miniaturization in dimensions of circuits and elements; and attain a higher degree of integration. A process for manufacturing a semiconductor of this structure is in the state of tightly installing a CVD film forming device, a plasma etcher, an ion implantation device, a high frequency induction heating type film quality improvement device, a wafer surface cleaning device, and further an exposure device and an optical inspection device with built-in excimer laser light source. The length CD-SEM: is used for quality control of a semiconductor circuit formed in such a manufacturing process; and hence is in the state of being affected by electromagnetic fields (AC magnetic field; alternating electromagnetic field; around 500 nT to 1 µT at frequencies exceeding 10 Hz (including power supply frequencies of 50 Hz to 60 Hz): DC magnetic field, static magnetic field; around 300 nT to 650 nT at frequencies lower than 10 Hz) generated by peripheral devices and an on-site wireless LAN (2.4 GHz band) used for FA equipment. An electromagnetic field shielding plate that suppresses the influence of an electromagnetic field outside the device is essentially required in order to: scan electron beams at a high speed within a given range; and acquire it acquire images of circuit elements such as thin wires and holes on a wafer surface that are the observed objects faithfully to the real LSI patterning.

Patent Literature 1 discloses invention of constituting a plate material to which an amorphous material is applied and constituting a high-performance shield chamber in comparison with permalloy or a silicon steel sheet. Patent Literature 2 discloses invention that makes it easier to handle an amorphous plate material and reduces shape restrictions. Patent Literature 3 discloses invention of a magnetic field shielding material that is configured by stacking and integrating an amorphous magnetic sheet and a ferromagnetic sheet material as a composite metal plate and then annealing the composite metal plate in a situation where an external electromagnetic field is offset.

Further, Patent Literatures 4 to 6 describe that a silicon steel plate is overlaid on an amorphous material.

CITATION LIST

Patent Literature

Patent Literature 1: Japanese Unexamined Patent Application Publication No. S62-221199
Patent Literature 2: Japanese Unexamined Patent Application Publication No H11-26981
Patent Literature 3: Japanese Unexamined Patent Application Publication No. H4-266092
Patent Literature 4: Japanese Unexamined Patent Application Publication No. H7-231191
Patent Literature 5: Japanese Patent No. 2837595
Patent Literature 6: Japanese Patent No. 2606971

SUMMARY OF INVENTION

Technical Problem

A problem of a conventional electromagnetic field shielding plate has been that the weight of the material required for obtaining high shielding performance against an electromagnetic field of a relatively high frequency becomes heavy.

For the purpose of suppressing disturbances caused by electromagnetic waves in a semiconductor manufacturing environment for example, PC permalloy and µ-metal of soft magnetic materials and even silicon steel (electromagnetic steel) are used frequently as materials for electromagnetic field shielding plates. A material with a thickness of around 1 mm has been generally used in order to obtain shielding performance from a static magnetic field to a relatively mild alternating magnetic field in a frequency band of several tens of Hz by using such a material. Assuming a device with an outer shape of several thousand mm in width, depth, and height respectively therefore, when a PC permalloy material is selected, the specific gravity of the material is about 6.62 and hence the weight of shielding plates surrounding the 6 sides is 300 kg to 400 kg. When the weight of the device itself is 1,500 kg to 2,500 kg, a weight corresponding to about one fourth to one fifth of the weight is increased by the weight of the shielding material. A floor of a semiconductor manufacturing environment has a grating structure comprising a perforated floorboard and accompanying air exhaust from the floor toward the underfloor in many cases in order to reduce floating dust, the load capacity is restricted, and hence the reduction of a device weight is an important design item. Since a length CD-SEM device to which the present invention is applicable is used for process/quality control, multiple devices are placed closely in one manufacturing process in many situations and hence the weight reduction of the devices is more important.

A PC permalloy material: has a high initial magnetic permeability and a low coercive force (magnetism/magnetization hardly occurs when an external magnetic field disappears); and is used frequently as an electromagnetic field shielding material. The PC permalloy material contains 75% to 80% of nickel element by weight. The PC permalloy therefore tends to generate relatively large price fluctuations by the influence of international market on nickel materials and is in the situation of a relatively high material cost.

An electromagnetic field shielding material using a permalloy material makes use of the principle of concentrating a magnetic flux more on the permalloy material by a high magnetic permeability and reducing a magnetic flux density into a space surrounded by the permalloy material. Even though the permalloy material is effective for shielding in the band from a static magnetic field to frequencies lower than 10 Hz therefore, shielding performance against an AC magnetic field (alternating magnetic field) in the band from power synchronizing frequencies of 50 Hz to 60 Hz to a frequency higher than that has tended to be degraded. For shielding an electromagnetic field in a higher frequency band therefore, a method of attaching an aluminum material or the like of a high conductivity to the outer surface of the permalloy material and making use of electrostatic shielding by the conductivity of the aluminum material has been used in combination. Even though the MHz band electric field can be shielded by the electrostatic shielding effect of the aluminum material attached to the outermost layer, shielding performance commensurable with material weight and material cost against an electromagnetic field in a kHz band has not been obtained by the adverse effects of skin effect of an electromagnetic field and eddy currents generated in the material as the characteristics of the permalloy material.

The electron beam scanning speed of a length CD-SEM becomes faster because of increase in the number of processes per unit time and a higher resolution of a SEM image (increase in the number of pixels) for realizing high-precision dimensional measurement to finer patterns over a wafer and the measurement is susceptible to disturbances from electromagnetic fields in a band of frequencies 5 to 10 times the power frequency or higher frequencies. As stated above however, a sufficient shielding effect has not been obtained with a conventional shielding material.

Further, with the technologies described in Patent Literatures 4 and 5, a silicon steel sheet is used as a reinforcing material but has limited shielding performance with respect to weight. For example, since a relative magnetic permeability of a silicon steel sheet is about one digit (about 10 times) smaller than a permalloy material, a design with an increased plate thickness is required in comparison with the case of being configured by using a permalloy material in order to obtain equivalent shielding performance. When a silicon steel plate is designed with priority on weight reduction therefore, shielding performance is restricted.

The present invention has been established in view of the above problems and an object of the present invention is to provide an electromagnetic field shielding plate, its manufacturing method, an electromagnetic field shielding structure, and a semiconductor manufacturing environment, which allow a weight to be reduced while high shielding performance is secured against an electromagnetic field of relatively high frequencies.

Solution to Problem

An electromagnetic field shielding plate according to the present invention is configured by stacking a permalloy layer comprising a plate material or a sheet of permalloy and an amorphous layer comprising a plate material or a sheet of Fe—Si—B—Cu—Nb-based amorphous.

Advantageous Effects of Invention

An electromagnetic field shielding plate, its manufacturing method, an electromagnetic field shielding structure, and a semiconductor manufacturing environment according to the present invention can reduce a weight while high shielding performance against an electromagnetic field of relatively high frequencies is obtained.

Examples of more specific effects are explained hereunder. The effects however are not limited to those examples and an embodiment of obtaining none of the following effects may sometimes be included in the scope of the present invention.

With regard to shielding performance against an electromagnetic field, in a frequency band of lower than 50 Hz, an electromagnetic field shielding plate using permalloy such as PC permalloy has been able to concentrate a magnetic flux into the material by using a high magnetic permeability of the material and a shielding effect has been obtained relatively efficiently in response to the thickness of the material. In a band from power frequencies (50 Hz to 60 Hz) to 500 Hz and a band of kHz however, sufficient shielding performance has not been obtained with respect to the weight of the shielding material.

A stacked structure according to a specific embodiment of the present invention can use an attenuation shielding effect in an amorphous layer, a shielding effect by a reflection effect at the interface between a PC permalloy layer and the amorphous layer, and a concentration effect of a magnetic flux in the PC permalloy layer in combination. In a frequency band of not lower than power frequencies (50 Hz to 60 Hz) therefore, reduction in magnetic permeability caused by eddy currents increasing in response to the material thickness of a PC permalloy material and a skin effect of an electromagnetic field in a high frequency band is supplemented and hence shielding performance against an alternating electromagnetic field of higher frequencies can be improved in comparison with an electromagnetic field shielding plate comprising a PC permalloy single layer.

Further, by being stacked with an amorphous material, it is possible to reduce the plate thickness of a PC permalloy layer in the state of securing shielding performance. Since PC permalloy has a large mass because of a high nickel content, if the amount of a PC permalloy material used can be reduced, the weight of a shielding member can be reduced by 30% to 40% in some cases.

Furthermore, by reducing the amount of a permalloy material used, it is possible to: reduce the influence of price fluctuations on nickel materials; and stabilize and reduce the cost of a shielding material.

DESCRIPTION OF EMBODIMENTS

Embodiments according to the present invention are explained hereunder on the basis of attached drawings. The present invention relates to an electromagnetic field shielding plate for example. The electromagnetic field shielding plate comprises a stacked material configured by stacking at least one layer each of an Fe—Si—B—Cu—Nb-based amorphous material and permalloy (PC permalloy, µ-metal, etc.) as the basic configuration. The electromagnetic field shielding plate is hereunder referred to as merely a "shielding plate" in some cases.

First Embodiment

Figure 1:
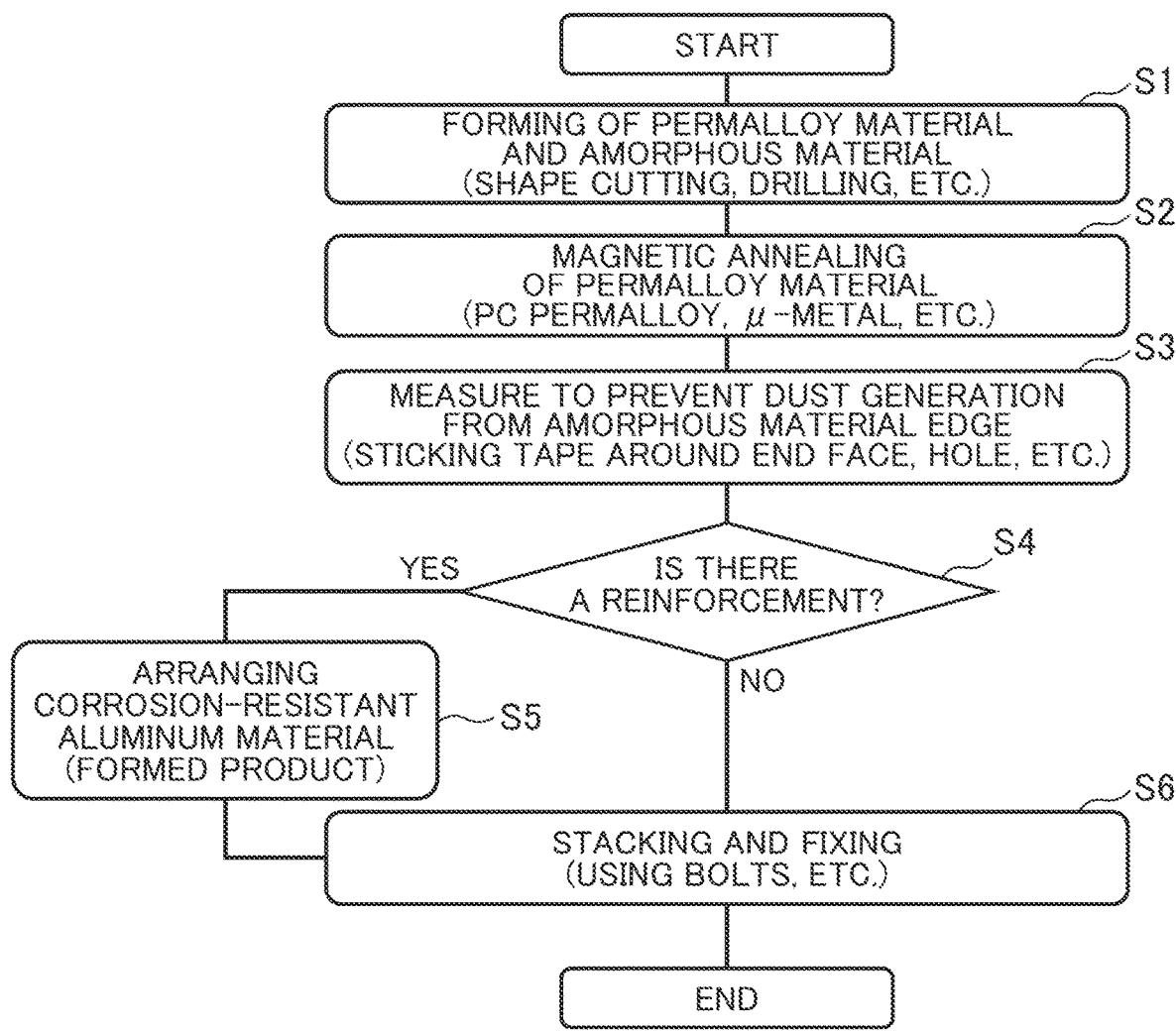
FIG. 1 is a flowchart explaining an example of a method for manufacturing an electromagnetic field shielding plate according to First Embodiment of the present invention.

FIG. 1 is a flowchart explaining an example of a method for manufacturing an electromagnetic field shielding plate according to First Embodiment of the present invention. In the present embodiment, PC permalloy is selected as an example of permalloy. Firstly, a permalloy material and an amorphous material are formed (Step S1). At Step S1, a permalloy layer comprising a plate material or a sheet (a plate material is adopted in the present embodiment) of a permalloy material and an amorphous layer comprising a plate material or a sheet (a sheet is adopted in the present embodiment) of Fe—Si—B—Cu—Nb-based amorphous are formed. The permalloy layer can comprise a plate material or a sheet of PC permalloy or p-metal for example as stated above.

The forming process at Step S1 includes cutting, outer shape forming, drilling: etc. if necessary. After Step S1 magnetic annealing nay be applied to the permalloy layer at a temperature appropriate for the material (Step S2). As a result of this, distortion and transition of a metallographic structure that are generated at Step S1 (particularly shape forming, etc.) and cause the material characteristics such as a magnetic permeability to deteriorate can be removed.

Successively, measures to prevent dust generation from an edge of the amorphous layer may be applied (Step S3). It is concerned that metal elements constituting amorphous are separated and scattered as minute dust if bending, deformation, etc. are given to the material when the amorphous material (plate material or the like) is handled. In an environment of semiconductor manufacturing where a fine electronic circuit is formed by lithography or physical processing, it is preferable sometimes to suppress the generation of such dust and metallic foreign matters (particles).

Figure 2:
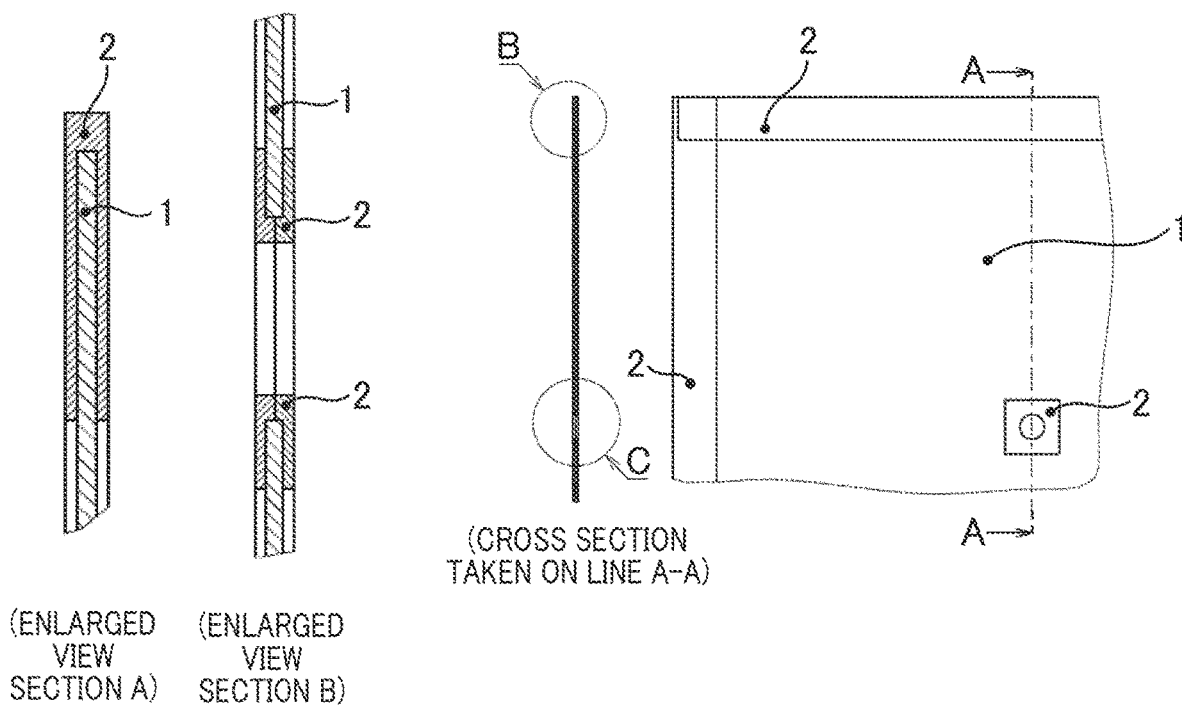
FIG. 2 is a view showing an example of measures to prevent dust generation from an edge of an amorphous layer.

FIG. 2 shows an example of such measures. A resin tape material 2 is attached to processed or cut end faces (including fixing holes used at the time of stacking and fixing) and the peripheries of the end faces in a material (for example plate material) constituting an amorphous layer 1. The B part in FIG. 2 is peripheral part of the amorphous layer 1 and the C part in FIG. 2 is the periphery of a fixing hole in the amorphous layer 1. The sin tape material 2 is an example of a coating layer with which an edge or an opening in the amorphous layer 1 is covered so as not to be exposed.

The coating layer covers one side to the other side of the amorphous layer 1 through an edge and an opening, for example. The coating layer can be configured so as not to expose a processed edge of the amorphous layer 1 and to cover the entire edge. If there are multiple edges or openings, it is preferable to apply a coating layer to all of them but some effects can be obtained even if it is not.

The resin tape material 2 is a resin tape material having an adhesive layer on one side for example. By configuring a processed or cut edge of the amorphous layer 1 so as not to be exposed in this way, it is possible to inhibit metallic foreign matters from being generated from the amorphous layer 1.

Whether or not the attached resin tape material 2 has electric conductivity seems not to influence shielding performance. In order to obtain higher shielding characteristics in the state of stacking the amorphous layer 1 and the permalloy layer 3 however, it is desirable to select and design the width and thickness of the resin tape material 2 so as to be able to secure the contact area of both the amorphous layer 1 and the permalloy layer 3 as wide as possible.

Here, when both Step S2 and Step S3 are executed, those may be executed simultaneously or in the reverse order of FIG. 1.

Successively, whether to use a reinforcing material is judged (Step S4). The judgment can be executed appropriately by a person skilled in the art in response to an application, required performance, and others of shielding plate.

When a reinforcing material is used, the reinforcing material is formed by using a formed product of a corrosion-resistant aluminum material for example (Step S5). The details of the corrosion-resistant aluminum material are described later in reference to FIG. 4 and others.

After Step S4 or Step S5, a shielding plate is configured by stacking and fixing the permalloy layer and the amorphous layer (further a reinforcing material, if necessary) (Step S6). Bolts can be used for fixing for example. In the present embodiment, on this occasion, another material is not interposed at the interface between both the layers, the opposing surfaces of both the layers are in the state of touching each other directly, as few gaps (spaces) as possible are formed, and both the layers are stacked and fixed.

For example, a shieling plate has an electromagnetic field shielding region having predetermined shielding performance and a permalloy layer and an amorphous layer touch each other in the entire electromagnetic field shielding region. An electromagnetic field shielding region means a region designed so that a shielding plate may have a function of shielding an electromagnetic field and, when a region not requiring the function of shielding an electromagnetic field at a periphery, fixing part, n opening, and the like of a shielding plate exits for example, such a region not included in the electromagnetic field shielding region. Such an electromagnetic field shielding region may also occupy almost the entire surface of a shielding plate.

Figure 3:
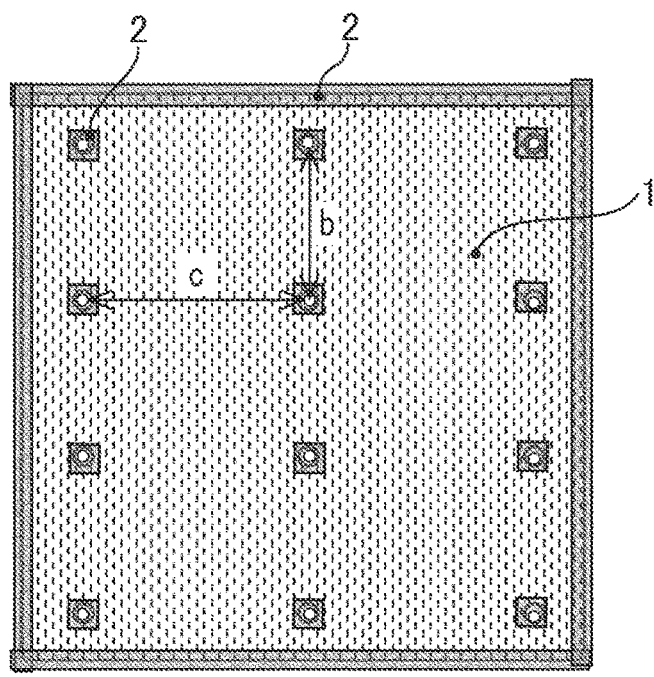
FIG. 3 is a view showing an example of an amorphous layer provided with a coating layer comprising a resin tape material around edges and around fixing holes.
Figure 4:
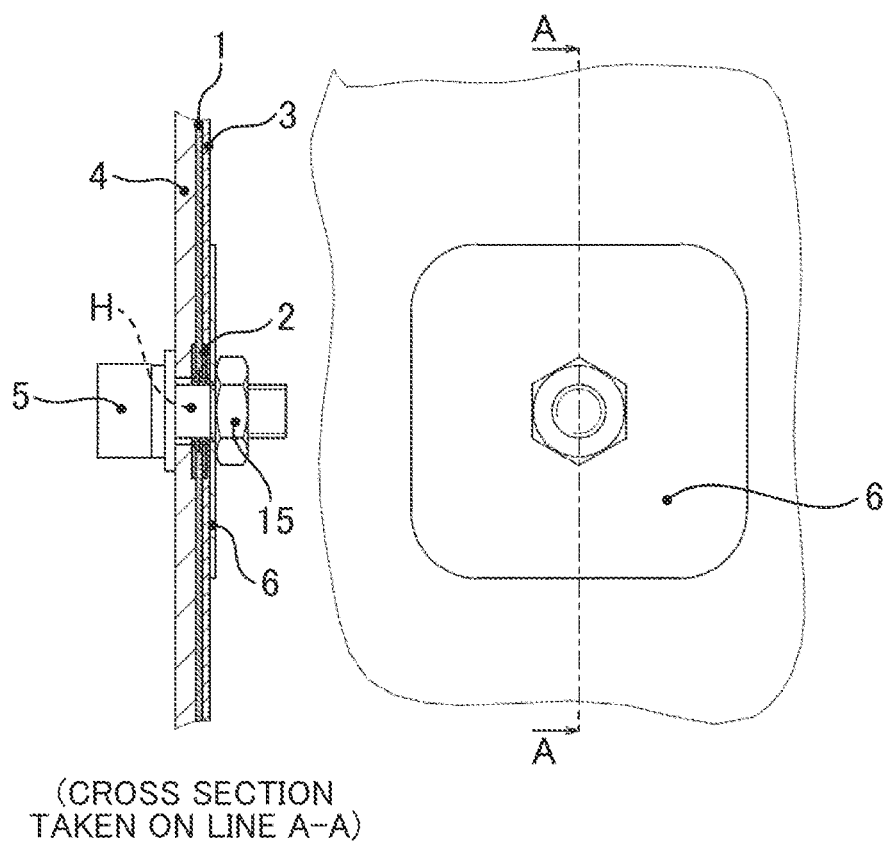
FIG. 4 is an enlarged sectional view of a shielding plate comprising three layers of a corrosion-resistant aluminum plate material layer, an amorphous material layer, and a permalloy material layer.

An example of a configuration for stacking and fixing a permalloy layer 3 and an amorphous layer 1 is shown in FIG. 3 and FIG. 4. FIG. 3 includes peripheries and shows only the amorphous layer 1 provided with a coating layer comprising a resin tape material 2 around fixing holes. FIG. 4 is a view including a partially enlarged sectional view of a shielding plate comprising three layers of a corrosion-resistant aluminum plate material 4, an amorphous layer 1, and a permalloy layer 3. In the example, the permalloy layer 3 and the amorphous layer 1 are perforated in matrixes, respectively. The perforation interval is b in the vertical direction and c in the horizontal direction. The shielding plate has a fixing member (first fixing member) comprising a non-magnetic material and the fixing member is arranged in the perforated hole H (first through hole). As the non-magnetic material, a SUS316 materialor a SUS304 material can be used for example (the non-magnetic properties of the SUS304 material are inferior to the SUS316 material).

In the example of FIG. 4, the shielding plate has a corrosion-resistant aluminum plate material 4. The corrosion-resistant aluminum plate material 4 is a formed product of the corrosion-resistant aluminum material arranged at Step S5 in FIG. 1.

The first fixing member comprises a bolt 5 and a nut 15 which are non-magnetic materials, for example. By the bolt 5 penetrating a hole H and being screwed and tightened with the nut 15, the bolt 5 and the nut 15 fix the amorphous layer 1 and the permalloy layer 3 to each other at the hole H. As a result of this, a stacked material (an amorphous layer 1 and a permalloy layer 3) can be integrated and retained.

When both the layers are stacked and fixed, as the first fixing member, another configuration may be used in ea of or in addition to the bolt and the nut. In the example of FIG. 4, a reinforcing plate material 6 is arranged around the hole H as a reinforcing layer comprising a reinforcing material. The reinforcing plate material 6 gets in surface contact with the amorphous layer 1 or the permalloy layer 3. The reinforcing plate material 6 can be used for suppressing deformation caused by external force and can suppress the deterioration of magnetic properties.

Figure 5:
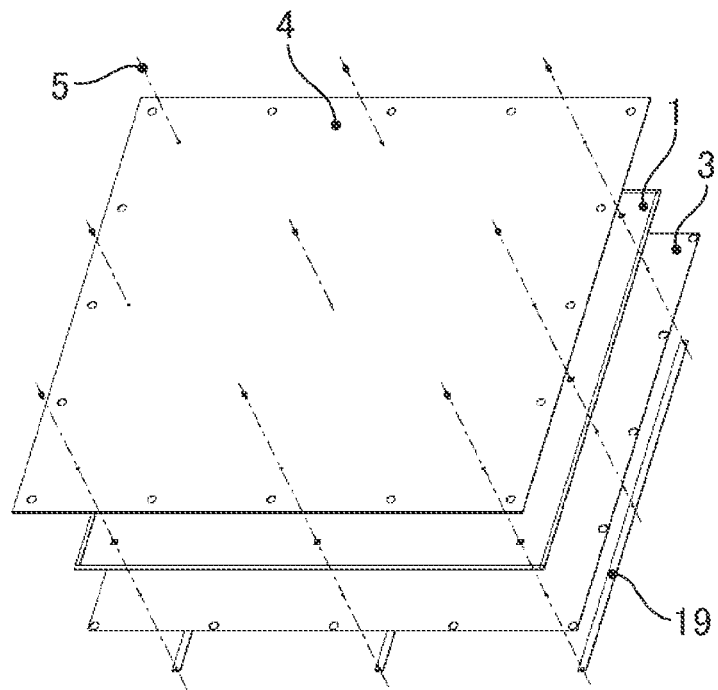
FIG. 5 is a view showing an example of a configuration not using nuts.

An example of a configuration not using nuts is shown in FIG. 5. In this example, a plate material 1 in which female thread elements are formed is arranged instead of nuts. When the plate material 19 in which the female thread elements are formed is used, the plate material 19 can be arranged inside an electromagnetic field shielded space for example (as a concrete example, on the opposite side of the permalloy layer 3 from the amorphous layer 1). By being arranged in this way, the deterioration of shielding performance caused by resonance generated by matching the end face length of a component with a wavelength of an external electromagnetic field when an electromagnetic field around a MHz band is shielded can be suppressed.

The thickness of a plate material or a sheet constituting a permalloy layer 3 can be designed arbitrarily but is preferably about 0.3 mm or more in consideration of handling in shape forming such as cutting or bending, deformation due to heat at magnetic annealing process after shape forming, workability of stacking assembly with an amorphous layer 1, and the like.

A permalloy material (for example, a PC permalloy material) 0.3 mm in thickness may sometimes be insufficient in mechanical strength as a shielding material plane of a single layer in some applications.

For example, it happens to generate the deformation or strain of a plate material that deteriorates magnetic properties easily by the load of external force. To deal with this, a corrosion-resistant aluminum plate material 4 may be used with the aim of suppressing the deformation of the plate material and reinforcing the plate material as a planar member.

The corrosion-resistant aluminum plate material 4 comprises a material of 5000 series, for example. The thickness of the corrosion-resistant aluminum plate material 4 can be designed appropriately and, depending on an application, a sufficient strength is obtained if the thickness is 1 mm or more in some cases and the weight falls within an acceptable range if the thickness is 1.5 mm or less in some cases. The thickness of the corrosion-resistant aluminum plate material 4 therefore can be in the range of 1 mm to 1.5 mm, for example.

The corrosion-resistant aluminum plate material 4 is attached to the outermost surface (as a concrete example, on the opposite side of the amorphous layer 1 from the permalloy layer 3) of an electromagnetic field shielded space and constitutes a stacked shielding plate. That is, the stacked configuration is a 3-layered configuration comprising a corrosion-resistant aluminum plate material 4 (outermost plane), an amorphous layer 1 (intermediate layer), and a permalloy layer 3 (inner plane) as shown in FIG. 4. In this example, an amorphous layer 1 is arranged as the intermediate layer and is interposed between corrosion-resistant aluminum plate material 4 as the reinforcing material of the outermost plane and the permalloy layer 3 of the inner plane and fixed. As it is obvious from the figure, on this occasion, the corrosion-resistant aluminum plate material 4 is also provided with perforated holes H (first through holes) and the bolts 5 and the plate materials 19 (or the bolts 5 and the nuts 15) fix the corrosion-resistant aluminum plate material 4, the amorphous layer 1, and the permalloy layer 3 to each other at the respective holes H.

Figure 6:
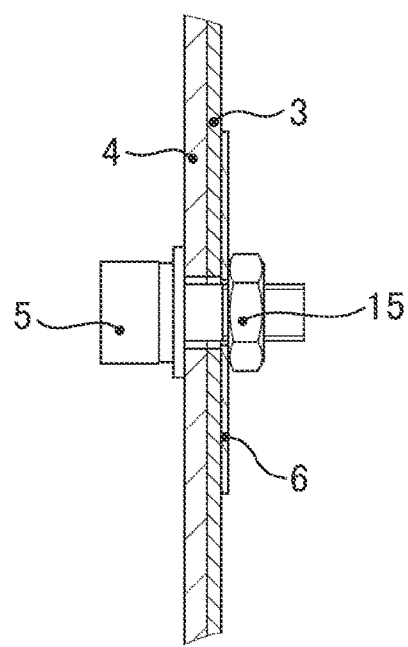
FIG. 6 is a view showing an example of a configuration of a conventional electromagnetic field shielding plate.

An example of a conventional configuration is, shown in FIG. 6 for comparison. This example is not provided with an amorphous layer 1 and a corrosion-resistant aluminum plate material 4, a permalloy layer 3, and a reinforcing plate material 6 are fixed with a bolt 5 and a nut 15.

Figure 7:
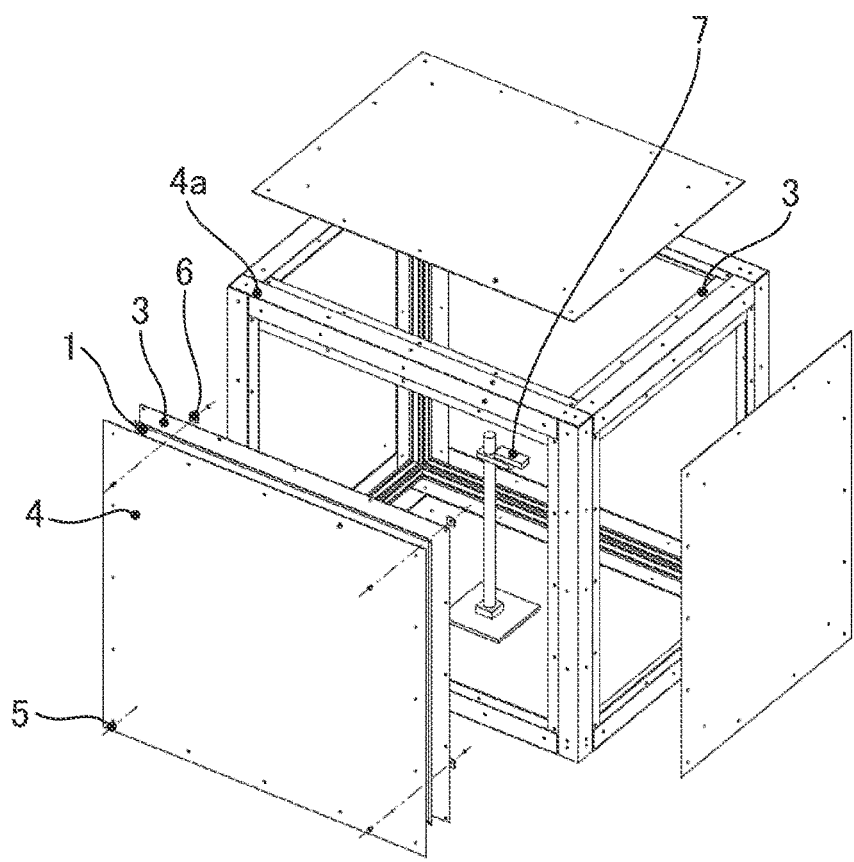
FIG. 7 is a view showing an example of an electromagnetic field shielding structure having electromagnetic field shielding plates.

An example of an electromagnetic field shielding structure having an electromagnetic field shielding plate according to the present embodiment is shown in FIG. 7. In this example, the dimensions are 831 mm in width, 1,071 mm in depth, and 1,028 mm in height. The results of the experiment of configuring a shielding model using the electromagnetic field shielding structure in FIG. 7 and verifying the shielding effect are described hereunder.

A shielding model is installed inside a magnetic field generation cage using a Helmholtz coil and a magnetic field is applied from the outside of the shielding model. As the directions of applying a magnetic field, three patterns of the X direction (for example, the width direction), the Y direction (for example, the depth direction), and the Z direction (for example, the height direction) are used. The magnetic flux density of the magnetic field is set to 1 µT and the frequencies of the magnetic field are set to the static magnetic field (frequency of 1 Hz) and the alternating magnetic field (frequencies of 50 Hz to 500 Hz). In the internal space of the shielding model, a field gate coil type magnetic field sensor 7 is arranged in the static magnetic field and a three-dimensional electromagnetic field sensor is installed in the alternating magnetic field with a frequency band of 5 Hz or more and a magnetic flux density inside the shielding model is measured.

Figure 8:
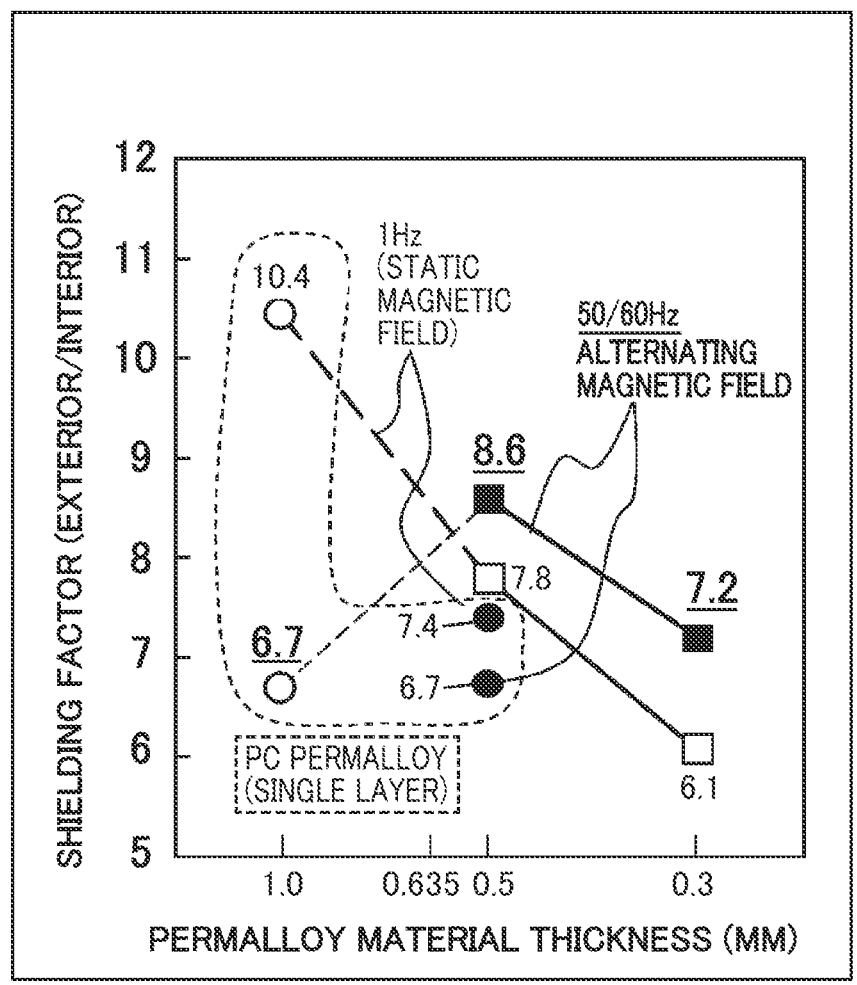
FIG. 8 is a graph showing experimental results using shielding models.

The results of the experiment are shown in FIG. 8. The horizontal axis represents the thickness of a permalloy layer 3 and the vertical axis represents a shielding factor. A shielding factor is a value obtained by dividing a magnetic flux density outside the shielding model by a magnetic flux density in the internal space of the shielding model, PC permalloy is used for the permalloy layer. The circles (white circles and black circles) are the measurement results when a shielding plate (for example, FIG. 6) comprising a permalloy single layer is used as the comparative examples. The square narks (white squares and black squares) are the measurement results when a shielding plate according to an embodiment of the present invention is used.

In the case of the power frequency (50 Hz or 60 Hz), a shielding plate including only a PC permalloy layer 1 mm in thickness according to the conventional technology obtains a shielding factor of 6.7. Further, a shielding plate including only a PC permalloy layer 0.5 mm in thickness according to the conventional technology obtains a shielding factor of 6.7, likewise.

In contrast, as an embodiment of the present invention, when a stacked structure of a PC permalloy layer 0.5 mm in thickness and an amorphous layer is used, the shielding factor is 8.6 (here, the thickness of an amorphous layer does not affect the result so much and the thicknesses are about 0.4 mm to 0.5 mm, for example. The same shall apply hereinafter). Fu her, as another embodiment of the present invention, when a stacked structure of a PC permalloy layer 0.3 mm in thickness and an amorphous layer is used, the shielding factor is 7.2. That is, it can be said that equivalent or better shielding performance is obtained even though the thickness of a permalloy layer is reduced to about one-third.

In this way, a shielding plate according to an embodiment of the present invention has high shielding performance at least in a power frequency. The shielding plate according to an embodiment of the present invention therefore is useful for electromagnetic field shielding of a device that is susceptible to an alternating magnetic field of a power frequency. For example, the shielding plate according to an embodiment of the present invention is thought to exhibit a remarkable effect as an electromagnetic field shielding plate for a scanning electron microscope. The shielding plate according to an embodiment of the present invention however is not limited to a scanning electron microscope but also applicable to a charged particle beam device. The charged particle beam device includes a semiconductor inspection apparatus that uses a transmission electron microscope, a focused ion beam device, and an electron microscope. Further, the shielding plate according to an embodiment of the present invention is thought to exhibit a remarkable effect in a semiconductor manufacturing environment having the shielding plate and semiconductor manufacturing related devices driven by an alternating power source with frequencies of 50 Hz or more.

In the static magnetic field (1 Hz), the shielding plate according to the conventional technology including only a PC permalloy layer 1 mm in thickness obtains a shielding factor of 10.4. Further, the shielding plate according to the conventional technology including only a PC permalloy layer 0.5 mm in thickness obtains a shielding factor of 7.4.

In contrast, as an embodiment of the present invention, when a stacked structure of the PC permalloy layer 0.5 mm in thickness and an amorphous layer is used, the shielding factor is 7.8. Further, as another embodiment of the present invention, when a stacked structure of a PC permalloy layer 0.3 mm in thickness and an amorphous layer is used, the shielding factor is 6.1.

The weights of the shielding plates in this state are compared. The size of the shielding plates is set to 980 mm in width and 940 mm in height. For equalizing conditions between the comparative examples and the embodiments of the present invention, a corrosion-resistant aluminum plate material 1.5 mm in thickness is attached as the outermost layer in both the cases. In the shielding plate of the comparative example (a PC permalloy material single layer 1 mm thickness), the total weight is about 11.2 kg by summing the weight 7.47 kg of the permalloy material and the weight 3.7 kg of the corrosion-resistant aluminum plate material.

In contrast, in the embodiment of the present invention, in the shielding plates of the same size, the weight of the PC permalloy layer 0.3 mm thickness is 2.42 kg, the weight of the stacked amorphous layer is 0.703 kg, the weight of the corrosion-resistant aluminum plate material is 3.7 kg similarly to the comparative example, and the total weight is about 6.8 kg. In this ay whereas the weight of the comparative example (PC permalloy 1 mm in thickness) is about 11.2 kg, a weight reduction of about 40% is attained.

The thickness of a permalloy layer stipulates the shielding performance against a comparatively mild alternating magnetic field in the band from a static magnetic field to several tens of Hz. In this band, the thicker the permalloy layer, the more the magnetic flux is concentrated in the permalloy material of a high magnetic permeability and hence the magnetic flux leaking inside the shielded space reduces and the shielding performance improves. The shielding performance of the permalloy layer however tends to be degraded as the frequency increases. The reasons are: the effect of back electromotive force due to eddy currents excited in the material by the electromagnetic field; skin effect in a high frequency electromagnetic field; physical characteristics such as electrical resistance of permalloy itself; and the like.

As an example of balancing weight reduction of a shielding plate, shielding performance against an electromagnetic field with frequencies of lower than 10 Hz, and shielding performance in a band of frequencies higher than the power frequency, the thickness of a permalloy layer can be selected in the range around 0.5 mm. When the thickness is 0.5 mm or more, sufficient shielding performance can be obtained in some applications and, when the thickness is 0.635 mm or less, the weight can be reduced sufficiently in some applications. In this way, in an embodiment, the thickness of a permalloy layer is preferably in the range of 0.500 mm to 0.635 mm. On this occasion, it is possible to obtain both the shielding performance due to magnetic flux concentration in a low frequency band caused by the contribution of the magnetic permeability of a permalloy material and the shielding performance against an alternating magnetic field in a high frequency band (frequency band higher than the power synchronizing frequency of 50 Hz or 60 Hz) due to stacking effect with an amorphous material together and hence it is possible to achieve the shielding performance against the static magnetic field through the alternating magnetic field. As an example of the permalloy layer, a PC permalloy material 0.5 mm in thickness: has a moderate plate material rigidity in outer shape forming, magnetic annealing process, and stacking assembly process; has workability better than a PC permalloy material 0.3 mm in thickness; and hence is thought to be effective from the viewpoint of mass production.

As shown in the graph of FIG. 8, against the static magnetic field of 1 Hz, whereas the shielding factor of the conventional shielding plate (the PC permalloy layer 1 mm in thickness) is 10.4, the shielding rate of the shielding plate (the PC permalloy layer 0.5 mm in thickness and the amorphous layer) according to an embodiment of the present invention reduces to 7.8. Against the alternating electromagnetic field with the frequencies of 50 Hz to 60 Hz however, whereas the conventional shielding plate reduces to 6.7, the shielding factor of the shielding plate according to an embodiment of the present invention is 8.6, the shielding performance is reversed, the shielding factor obtained with the stacked structure is higher than the shielding factor obtained with the permalloy single layer. The weight of the shielding plate on this occasion is about 8.2 kg in total of the weight 3.7 kg of the corrosion-resistant aluminum plate material (reinforcing material) 1.5 mm in thickness, the weight 3.74 kg of the PC permalloy layer 0.5 mm in thickness, and the weight 0.703 kg of the amorphous layer and weight reduction of about 30% is attained in comparison with about 11.2 kg of the conventional shielding plate (shielding plate comprising the permalloy layer 1 mm in thickness and aluminum as the outermost layer for equalizing the conditions).

Figure 9:
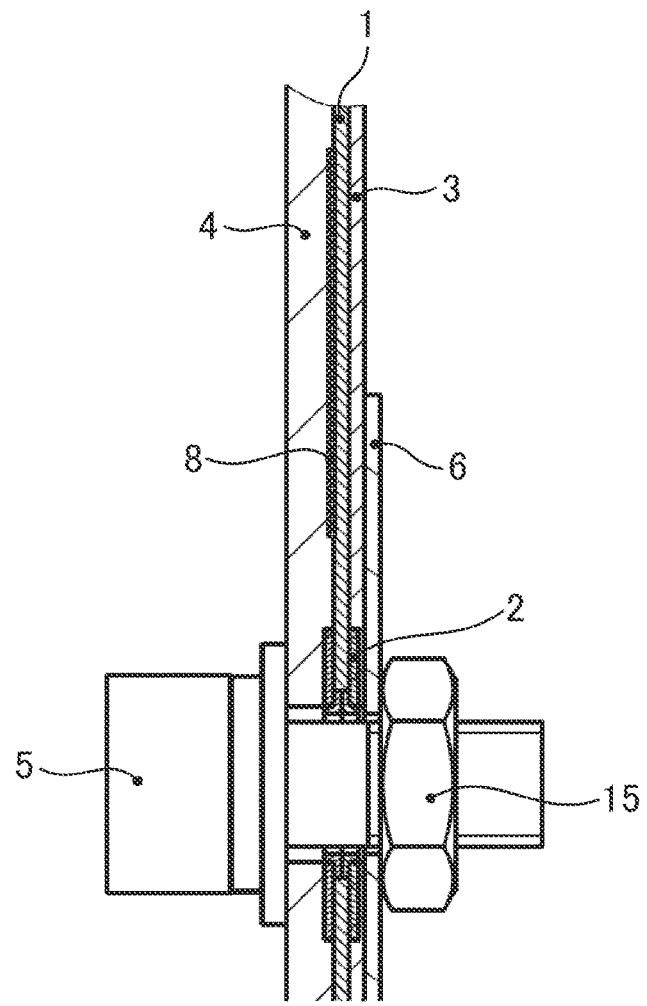
FIG. 9 is a view showing an example of a configuration in the case of using a double-sided adhesive tape for stacking and fixing a stacked material.

FIG. 9 shows an example of a configuration of using an adhesive for stacking and fixing a stacked material. In this example, a double-sided adhesive tape 8 is used as an example of the adhesive, the double-sided adhesive tape 8 is used between an amorphous layer 1 and a corrosion-resistant aluminum plate material 4, and those layers are bonded and fixed. Here, if the double-sided adhesive tape 8 is interposed between the amorphous layer 1 and a permalloy layer 3, the shielding performance may sometimes deteriorate. In the state where the double-sided adhesive tape 8 is interposed between the amorphous layer 1 and the permalloy layer 3, a gap (space) comprising the adhesive tape layer of a low magnetic permeability exists and the shielding performance was degraded by about 10% in actual measurement.

As shown in FIG. 9, a double-sided adhesive tape 8 can be used for stacking and fixing an amorphous layer 1 to a corrosion-resistant aluminum plate material 4 that is the outermost surface. That is, a corrosion-resistant aluminum plate material 4 and an amorphous layer 1 are bonded with a tape material having adhesive layers on both sides interposed. Shielding performance however can be enhanced further by adopting a structure in which: a tape material is not used between an amorphous layer 1 and a permalloy layer 3 so as not to hinder the movement of a magnetic domain wall and the like at the interface between both the materials; and the opposing surfaces of both the materials are in direct contact with each other in as large an area as possible.

Further, in an application that can tolerate a certain degree (for example, about 10%) of degradation in shielding performance, it is also possible to bond an amorphous layer 1 and a permalloy layer 3 with a double-sided adhesive tape 8 to form an embodiment of the present invention. Particularly, such a configuration enhances rigidity and becomes stronger against sonic vibration.

It is estimated that the improvement of shielding performance against an alternating magnetic field that is obtained by a shielding plate comprising a stacked structure of a permalloy layer 3 and an amorphous layer 1 is obtained by the combined action of: shielding effect due to phase change and reflection loss at the stacked interface between both the materials; shielding effect due to absorption loss of an electromagnetic field in the amorphous layer 1; and magnetic flux concentration into the permalloy layer 3.

Figure 10:
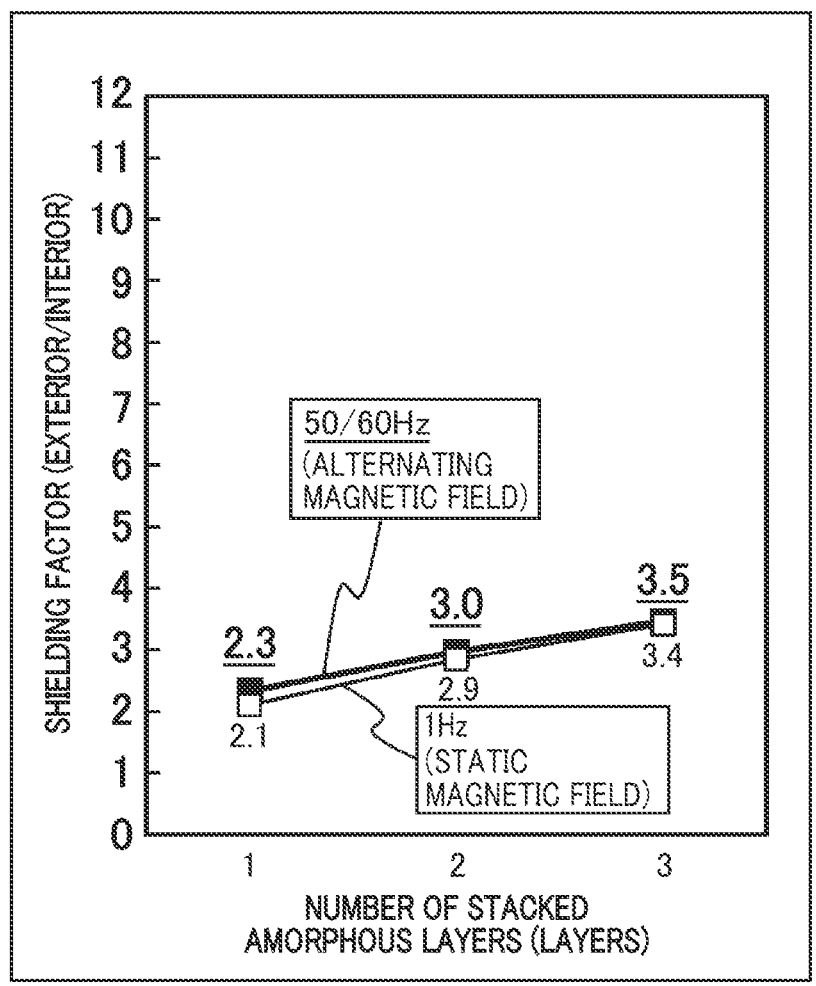
FIG. 10 is a view showing experimental results in the case of not using a permalloy layer as a comparative example.

The experimental results in the case of not using a permalloy layer 3 are shown n FIG. 10 as a comparative example. For contrastive comparison, a stacked configuration is formed by stacking only an amorphous magnetic material and a corrosion-resistant aluminum material of a reinforcing material and a shielding rate is measured. The shielding factors are measured actually in the cases of a single amorphous layer (single layer), a double-stacked amorphous layer, and a triple-stacked amorphous layer, respectively. As a result, slight increase in shielding rate is observed but the shielding factors are in the range of 2.1 to 3.5 like the graph in FIG. 10. The shielding factor of around 8.0 that can be obtained in the stacked material of a permalloy layer and an amorphous layer according to an embodiment of the present invention is obtained in neither a static magnetic field nor an alternating magnetic field.

In the contrastive experiment also shown in FIG. 8, with a shielding plate configured by using a PC permalloy material, whereas the shielding factor in 1 Hz static magnetic field is 10.4 by the magnetic flux concentration effect due to the magnetic permeability of the PC permalloy material, when the thickness of the PC permalloy material's halved to 0.5 mm; the magnetic flux permeating through the material educes by the reduction of the plate thickness and the shielding factor lowers to 7.4. In the case of an alternating magnetic field of the power frequencies of 50 Hz to 60 Hz however, whereas h shielding factor of the PC permalloy material 1 mm it thickness is 6.7, the shielding rate of the PC permalloy material 0.5 mm in thickness is also 6.7 and, unlike the case of a static magnetic field, a nearly identical shielding factor is obtained although the thickness of the permalloy material is reduced by half.

In contrast, with a stacked material of the PC permalloy layer 0.5 mm in thickness and the amorphous layer according to an embodiment of the present invention, the shielding factor in the alternating magnetic field of 50 Hz to 60 Hz is 8.6 and improves more than the shielding factor of 6.7 obtained by the shielding plate of the PC permalloy single layer 1 mm in thickness. It is judged that the thickness 1 mm of the PC permalloy material is not essential for the shielding performance against the alternating magnetic field with a power frequency (50 Hz or 60 Hz) or more.

As stated above, the advantages of a shielding plate obtained by stacking an amorphous layer and a layer of a permalloy material represented by a PC permalloy material are obvious froth both the viewpoints of the improvement of shielding performance against an alternating magnetic field with high frequencies of the power frequency or more and weight reduction of the shielding plate. Here, when weight is not an issue and only an improved shielding rate is required and the like, the thickness of the permalloy layer may be 1 mm or more.

Since an electromagnetic field shielding plate of a stacked structure according to an embodiment of the present invention is not in the state of stacking only relatively thin metal layers which are likely to generate sound wave resonance, such as a permalloy material and a corrosion-resistant aluminum for reinforcement, but has a structure of stacking a resin material contained in an amorphous layer, the resistance to sound wave resonance in the shielding plate caused by external sound waves is also improved.

If an Fe—Si—B—Cu—Nb-based material is used for an amorphous material stacked with a permalloy material, a large saturation magnetic flux density is obtained in comparison with the case of using a Co-based material and hence the Fe—Si—B—Cu—Nb-based material is judged to be appropriate for applications where a saturation magnetic flux density is important. The Co-based amorphous material seems to cause shielding performance to change with the lapse of time.

The internal structure of an amorphous layer 1 can be designed appropriately by those skilled in the art and, as an example, the layer may be configured by using a thin film tape (strip) of an amorphous material. For example, a plate material may be formed by arranging thin film tapes so that the orientations may change for each layer and stacking and integrating about 4 layers. Such a plate material is effective for the applications where anisotropy should be suppressed because the anisotropy of the magnetic properties is cancelled and the magnetic permeability becomes almost omni-directional.

In the experiments of FIG. 8 and FIG. 10, for model evaluation of an amorphous layer, a product sold under the product name "MS sheet" from KOYO SANGYO CO., LTD. is used. A similar product is also sold under the product name "FM SHIELD" from Hitachi Metals, Ltd. and both can be used together.

In the case of joining and using multiple shielding plates, the specific structure of the joint can be designed appropriately and an example is explained hereunder.

Figure 11:
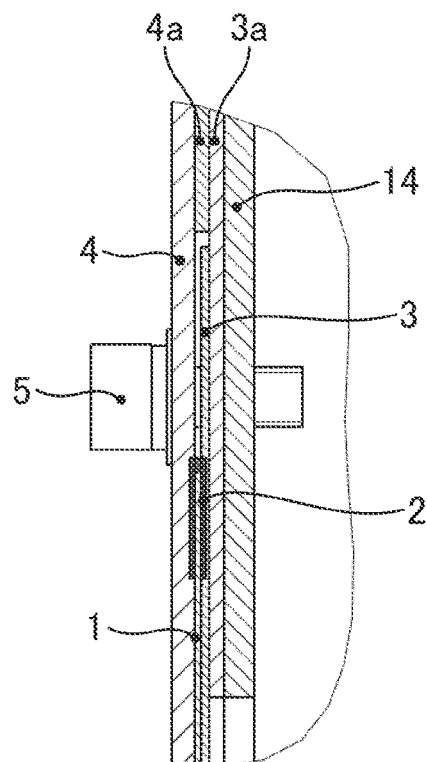
FIG. 11 is a view showing an example of a joint structure of multiple electromagnetic field shielding plates.
Figure 11:
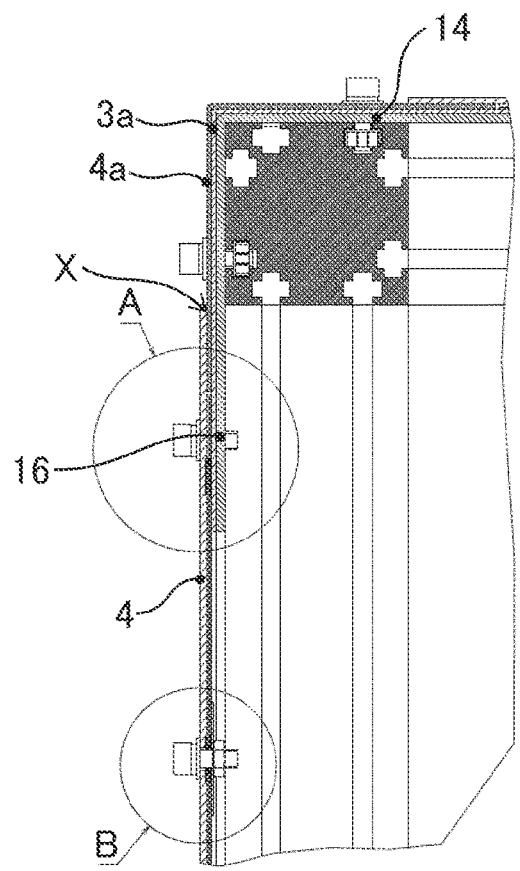
Figure 11:
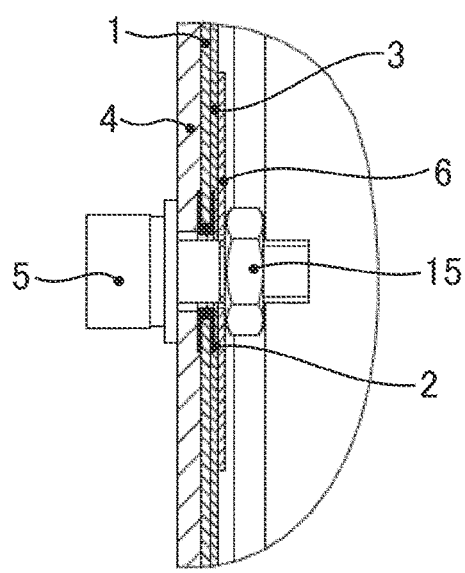

An example of a joint structure is shown in FIG. 11. In this example, as shown in the enlarged view of the A part, a planar shielding plate and a ridge connection member (it will be described later in detail in relation to FIG. 16 and others) are joined together. The shielding plate has an amorphous layer 1, a permalloy layer 3, and a resin tape material 2. The ridge connection member has a ridge corrosion-resistant aluminum plate material 4a, a ridge permalloy layer 3a, and a ridge stainless steel layer 14. The ridge stainless steel layer 14 is provided with a female thread element 16 that is screwed with a male thread element of a bolt 5. Here, the permalloy layer 3 of the shielding plate and the ridge permalloy layer 3a of the ridge connection member overlap each other at a region close to the respective end faces. By taking this structure, magnetic domain wall movement between the shielding plate and the ridge connection member is facilitated in the situation of applying an electromagnetic field from the exterior and the above-mentioned shielding performance can be ensured.

With regard to the shielding of an electromagnetic field with higher frequencies (for example, a band of frequencies of kHz, MHz, or higher), a shielding structure that is in a sealed state as a space is desirable but an electromagnetic field shielding structure used for an actual device requires an opening in some cases. An opening is required for example for the purpose of: loading and unloading semiconductor wafers into and from the shielded space; heat exhaust port from a mechanism and a control circuit; and moreover securing airflow inside a shielding plate space with the aim of preventing the accumulation of dust in a clean room environment and others. With such an opening, shielding performance may possibly deteriorate in comparison with an electromagnetic field shielding region where an amorphous layer 1 and a permalloy layer 3 are stacked but, depending on the structure of the opening, there is a possibility that the degradation in shielding performance can be suppressed relatively small.

Figure 12:
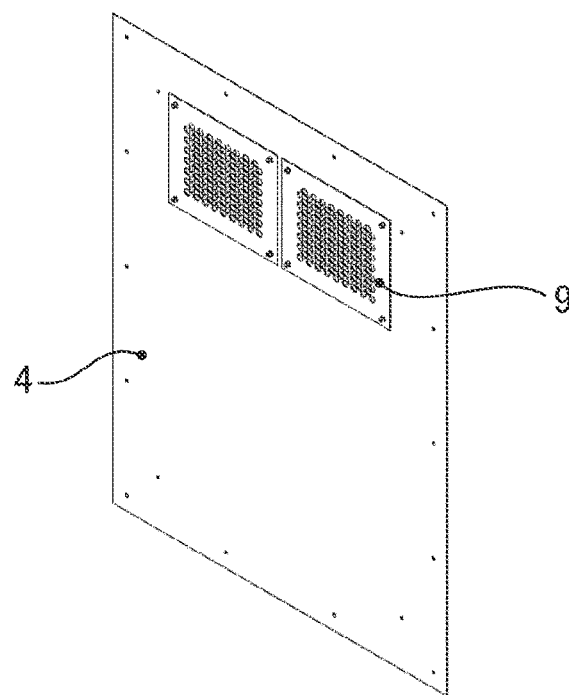
FIG. 12 is a view showing an example of an electromagnetic field shielding structure having openings.

Examples of electromagnetic field shielding structures having openings are shown in FIG. 12 to FIG. 15. An opening is for heat exhaust port for example but may also be for securing airflow. In the example of FIG. 12, the shielding structure has a plate 9 of a soft magnetic material provided with a large number of holes (for example round holes) with the dimensions of 8 mm to 10 mm or the like. The plate 9 of the soft magnetic material comprises permalloy, for example. The plate 9 of the soft magnetic material is attached to an opening and is fixed to a shielding plate at a position of covering the opening from the side of a corrosion-resistant aluminum plate material 4, for example. With this structure, the shielding rate varies by the dimensions of the holes, the number of the holes, frequencies of an external electromagnetic field, etc. and the electromagnetic field shielding rate may sometimes degrade by about 7% in comparison with a sealed state of no openings.

Figure 13:
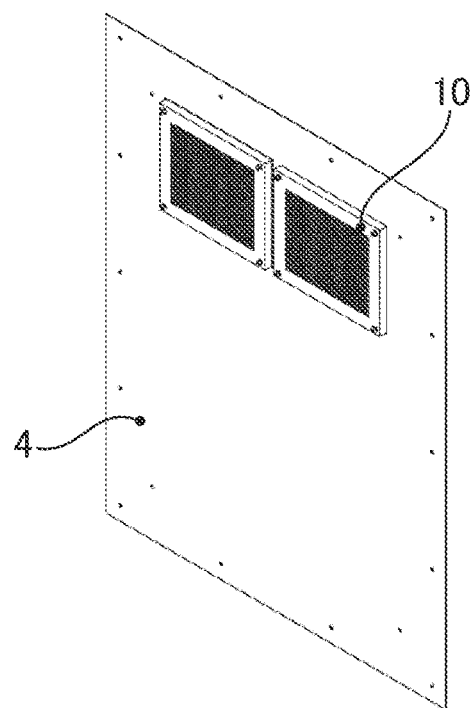
FIG. 13 is a view showing an example of an electromagnetic field shielding structure having other openings.
Figure 14A:
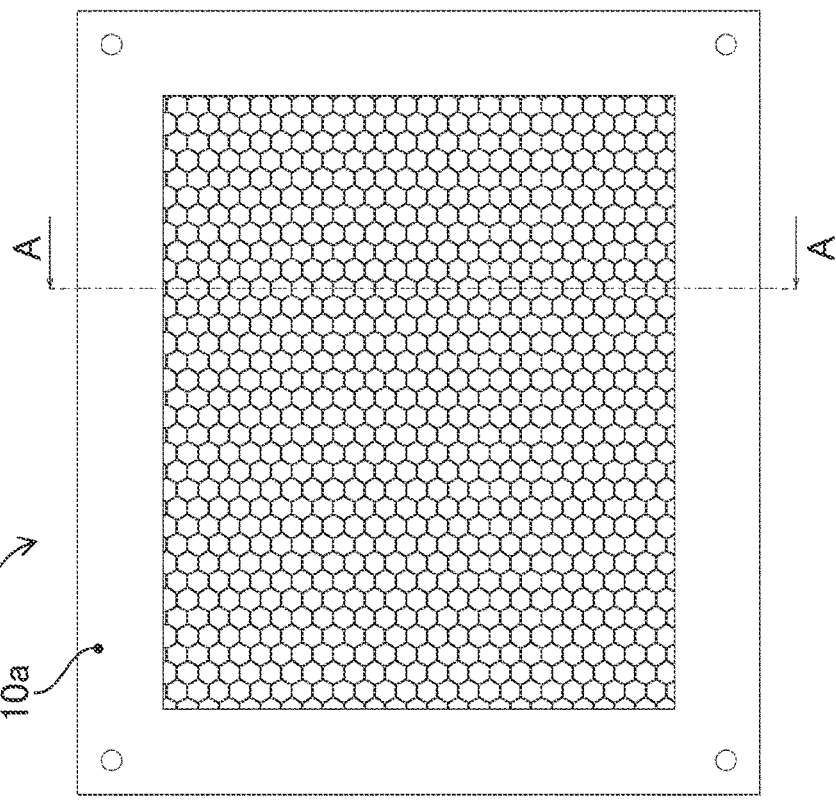
FIGS. 14A-14C are views showing a structure of the honeycomb material in FIG. 13 more concretely.
Figure 14B:
Figure 14C:
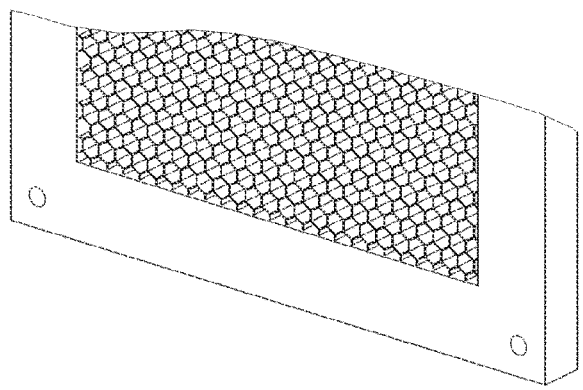

FIG. 13 shows another example of an opening. In this example, an electromagnetic field shielding structure has a honeycomb material 10 (honeycomb structural member) of an aluminum base material. FIG. 14 shows the structure of the honeycomb material 10 more specifically. FIG. 14(b) is a sectional view taken on line A-A of FIG. 14(a) and FIG. 14(c) is a partial perspective view.

The honeycomb material 10 is attached to an opening and fixed to a shielding plate at a position of covering the opening from the side of a corrosion-resistant aluminum plate material 4, for example. The honeycomb material 10 has a reinforcement 10a comprising a plate metal member on the outer circumference. With such a structure, the degradation in shielding rate is about 3% and the deterioration of shielding performance caused by the influence of the opening can be suppressed in comparison with the structure in FIG. 12.

When a relatively large opening is provided for loading and collecting wafers into and from the shielded space, the shielding performance tends to deteriorate. The causes of the deterioration are considered to be decrease in the area of a shielded region and decrease in the volume of the magnetic material as a total amount caused by the existence of the opening. With a plane of a large opening ratio in particular, with regard to shielding performance in the band from a static magnetic field to about several tens of Hz, the shielding effect by the concentration of a magnetic flux into a shielding plate decreases and hence the shielding performance deteriorates. In an electromagnetic field with the frequency band of 50 Hz to 500 Hz however, the influence of the opening is not clearly seen in comparison with a shielding rate in a sealed state and hence the influence of the opening seems to be small from the viewpoint of shielding performance against an alternating electromagnetic field.

In some of the characteristics of a device or the like arranged in a shielded space, the shielding performance against a static magnetic field with the band up to several tens of Hz is regarded as important. In such an occasion, as a means for supplementing the shielding performance by a plane having an opening (the volume of the magnetic material reduces), it is also possible to supplement the shielding performance by increasing the thickness of a permalloy layer in the plane.

Figure 15:
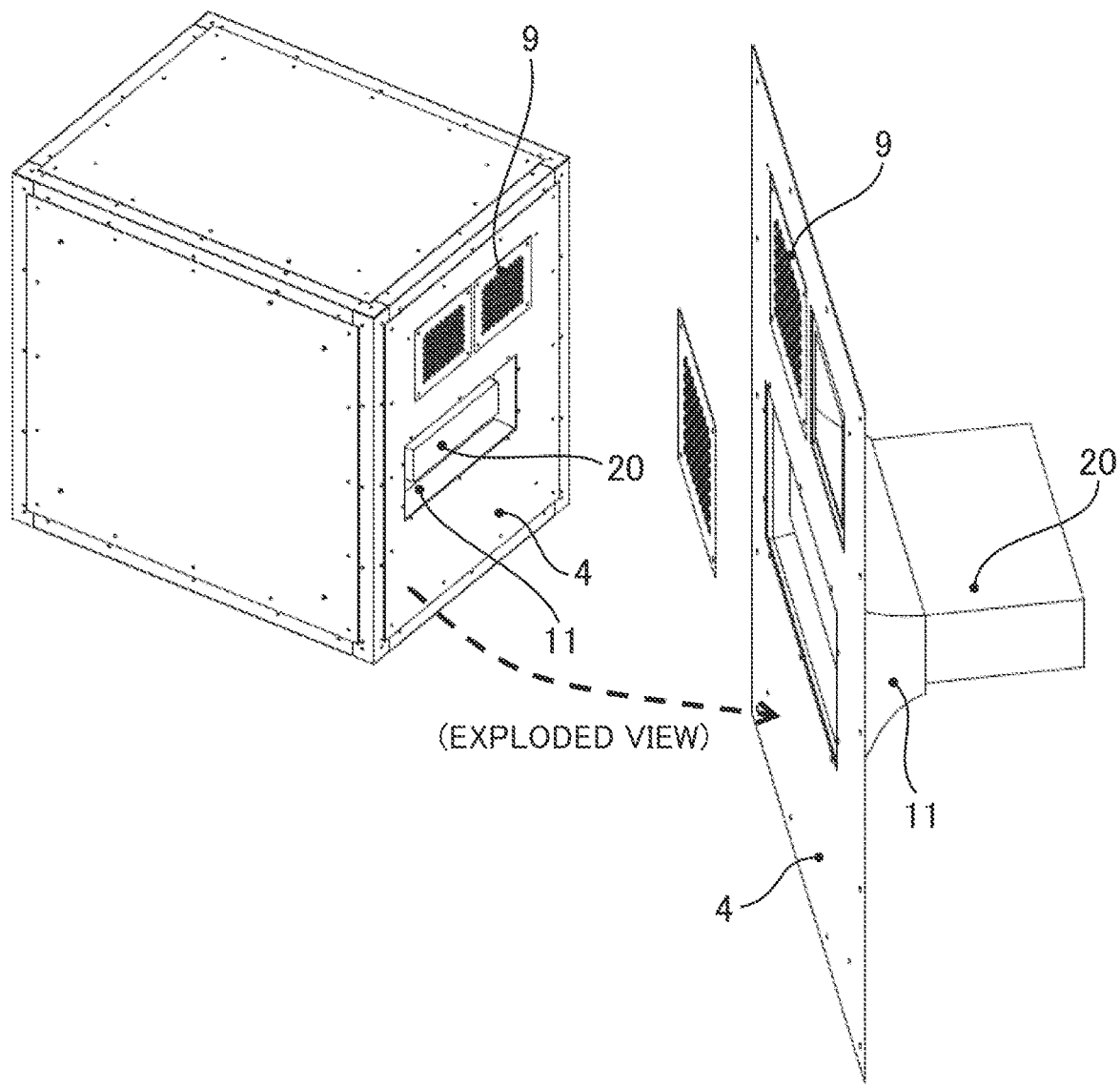
FIG. 15 is a view showing an example of a structure in the case where an electromagnetic field shielding structure is provided with an opening for wafer transfer.

FIG. 15 shows an example of a structure in the case where a shielding structure is provided with an opening for wafer transfer. As a measure for preventing electric field disturbances with a higher frequency band (80 MHz to 2.4 GHz) from intruding into the interior of a shielded space, a metal mesh 11 having a conductivity surrounds the periphery of the opening like a skirt. The metal mesh 11 has air permeability by the mesh structure and is a reticulated tube member formed in a tubular shape. The metal mesh 11 is attached so as to cover the opening and adhere to a shielding plate (in this example, so as to adhere to a corrosion-resistant aluminum plate material 4 of the outermost layer). The metal mesh 11 connects the opening of the shielding plate and a wafer loading and recovery unit 20 to each other.

By such a structure, in the state of keeping the air permeability in order to prevent dust from residing in a clean room environment, with regard to electromagnetic field shielding, it is possible to: prevent a resonance phenomenon at a specific frequency related to the length of a member; apply electrostatic shielding effect to the intrusion of radio waves directly into a shielded space from the opening; and suppress the decline of a shielding rate.

Further, it is also possible to reduce weight in comparison with a conventional shielding plate. Even in the case of applying a grating structure to a floor for air exhaust in a semiconductor manufacturing environment therefore, it becomes easier to meet the load-bearing constrains of the floor.

Second Embodiment

Second Embodiment relates to an electromagnetic field shielding structure having an electromagnetic field shielding plate according to First Embodiment. In particular, the electromagnetic field shielding structure according to Second Embodiment has a ridge and is constituted in a shape surrounding an internal space.

Figure 16:
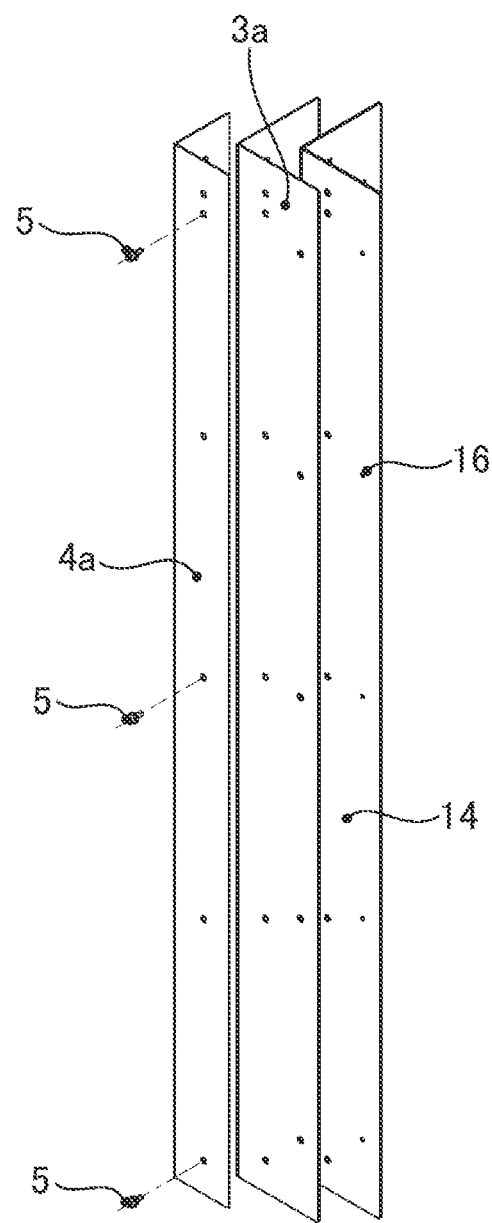
FIG. 16 is a view showing an example of a configuration of a ridge connection member according to Second Embodiment of the present invention.

An example of a configuration of a ridge connection member arranged at a ridge is shown in FIG. 16. The ridge connection member is a member for fixing multiple planar shielding plates in an angled arrangement to each other. The ridge connection member has a ridge forming a certain angle (first angle). The angle is 90 degrees in the example of FIG. 16 but can be changed arbitrarily as long as the angle is not 0 degree.

The ridge connection member is configured by stacking at least a ridge permalloy layer 3*a* and a ridge stainless steel layer 14. Further, a ridge corrosion-resistant aluminum plate material 4*a* may be stacked. The ridge permalloy layer 3*a* comprises a plate material or a sheet of permalloy. The thickness of the ridge permalloy layer 3*a* can be selected from a range similar to a permalloy layer 3 in a shielding plate. The ridge stainless steel layer 14 comprises an austenitic stainless steel material of a thickness in the range of 1.8 mm to 2.4 mm, for example.

In this example, the ridge connection member is configured by stacking a ridge corrosion-resistant aluminum plate material 4*a*, a ridge permalloy layer 3*a*, and a ridge stainless steel layer 14 from the outside toward the inside. Here, "outside" means a convex side of a ridge for example and "inside" means a concave side of a ridge for example. The ridge connection member may include a layer other than those layers on the inside or the outside.

The ridge connection member is provided with female thread elements 16 on both the sides of the ridge. The female thread elements 16 are prepared in the ridge stainless steel layer 14, for example. The ridge permalloy layer 3*a* may be provided with through holes at positions corresponding to the female thread elements 16.

At least a part on one side of the ridge of the ridge connection member and at least a part of an electromagnetic field shielding plate (first shielding plate) are fixed so as to overlap and at least a part on the other side of the ridge of the ridge connection member and at least a part of another electromagnetic field shielding plate (second shielding plate) are fixed so as to overlap. An example of such a configuration is shown in FIG. 11. In the enlarged view of the A part, a part of a ridge permalloy layer 3*a* and a part of a shielding plate (particularly, an amorphous layer 1 and a permalloy layer 3 in a shieling plate) are fixed with a bolt 5 and a ridge stainless steel layer 14 so as to overlap.

The ridge connection member itself has a function as a shielding plate to some extent by the shielding effect of the ridge permalloy layer 3*a* and the like. The ridge connection member can be configured by bending the material of each layer at a predetermined angle (for example, 90 degrees) and then stacking them in the state of direct contact.

The overall shape of such an electromagnetic field shielding structure can be designed appropriately and, for example, can be configured by arranging a permalloy layer 3 and a ridge permalloy layer 3*a* so as to overlap with each other without gaps on each side and tightening and fixing each shielding plate.

The ridge connection member may further have an amorphous layer. The amorphous material however is a brittle material and hence the material may possibly break by bending process. When bending process of an amorphous material is impossible, even if an amorphous material is omitted like FIG. 16, the effect of the present invention may be substantially obtained in some cases. For example, if there is a situation of allowing a magnetic domain wall to move between a ridge connection member and a shielding plate, a planar part that occupies most of the outer surface of the shielding structure in both area and volume can comprise a stacked material of a permalloy material and an amorphous material and hence at least the shielding effect as the present invention can be obtained to some extent.

Third Embodiment

In Third Embodiment, a larger shielding plate is configured by connecting multiple permalloy layers. An example of a shielding plate according to Third Embodiment is shown in FIG. 17.

Rolling process is used for forming a soft magnetic material such as a PC permalloy material and the material may sometimes have a standard width due to a rolling roll width. When a shielding plate is configured so that the width may be larger than the standard width, a structure of joining the materials is required.

Figure 17A:
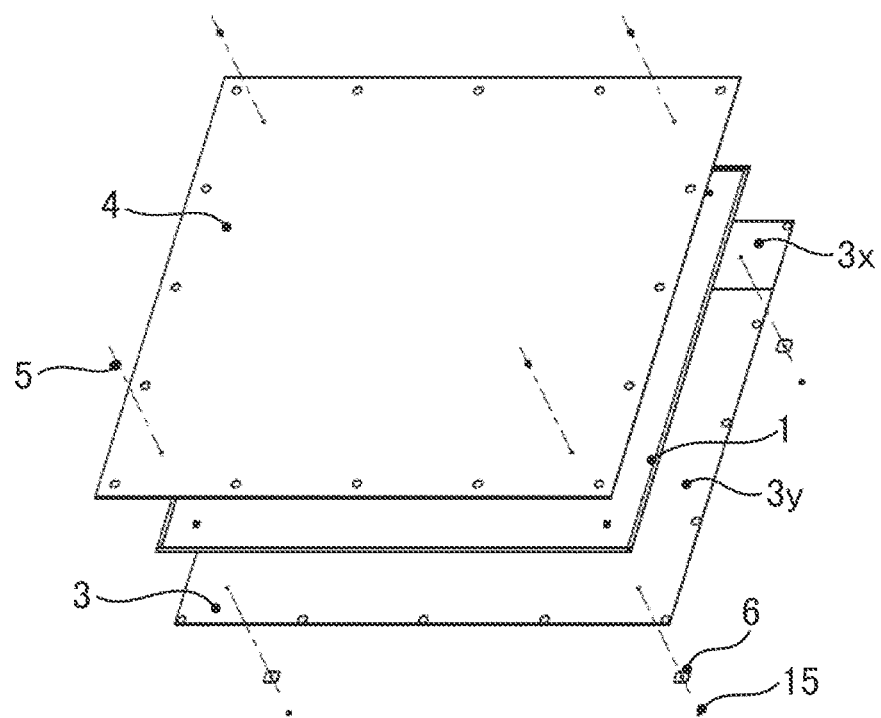
FIGS. 17A and 17B are views showing an example of a configuration of an electromagnetic field shielding plate according to Third Embodiment of the present invention.
Figure 17B:
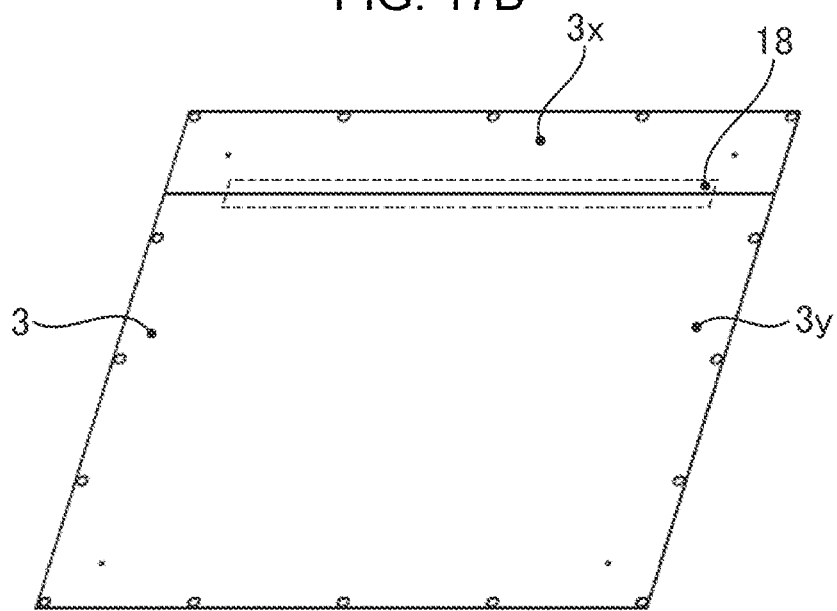

FIG. 17(*a*) shows a stacked configuration of such a shielding plate. Each of an amorphous layer 1 and a corrosion-resistant aluminum plate material 4 is one plate or one sheet but a permalloy layer 3 is formed by joining multiple plates.

FIG. 17(*b*) is a view extracting and showing the permalloy layer 3 of FIG. 17(*a*). The permalloy layer 3 is configured by butting a first permalloy layer 3*x* and a second permalloy layer 3*y*. After magnetic annealing to the first permalloy layer 3*x* and the second permalloy layer 3*y* is completed, the layers are joined by using a strip material 18 (strip-shaped plate). Dimensions and placement on this occasion are designed so that each of the first permalloy layer 3*x* and the second permalloy layer 3*y* may overlap with another layer (for example, an amorphous layer 1) respectively. The first permalloy layer 3*x*, the second permalloy layer 3*y*, and the strip material 18 comprise the same material (for example, PC permalloy) and can be joined by spot welding or screw fixing, for example.

Meanwhile, even though spot welding process is adopted, unless extreme deformation is applied to a permalloy layer by external force during work, the joint can be configured in the state of suppressing the influence of heat generated locally by welding. Further, by applying the joint by spot welding after magnetic annealing process, it is possible to suppress deformation caused by expansion and contraction due to heat of the magnetic annealing process.

The contact area of an amorphous layer 1 and a permalloy layer 3 should be as large as possible on the occasion of stacking and fixing but, if warping exists, it is disadvantageous for securing the contact area. In the joint when a permalloy layer exceeds the standard dimensions of the material, with the aim of increasing the contact area between an amorphous layer 1 and a permalloy layer 3, a strip material 18 is attached not to the surface on the side of stacking the amorphous layer 1 but to the surface on the other side (for example, the surface on the inner side of a shielded space). As a result, in the permalloy layer 3, unevenness of the surface on the side touching the amorphous layer 1 can be reduced and almost the same performance as one permalloy layer without joint can be obtained.

An example of a manufacturing method of the shielding plate shown in FIG. 17 is explained hereunder. Firstly, as permalloy layers, a first permalloy layer 3x and a second permalloy layer 3y are formed. Successively, magnetic annealing process is applied to the first permalloy layer 3x and the second permalloy layer 3y. After that, an end face of the first permalloy layer 3x and an end face of the second permalloy layer 3y are arranged so as to butt each other and a strip material 18 is arranged so as to cover at least a part of one surface adjacent to the butted end faces (for example, a surface on the side of not touching an amorphous layer 1 as stated above).

In the state of arranging the strip material 18 like this, the first permalloy layer 3x, the second permalloy layer 3y, and the strip material 18 are integrated by spot welding. In this way, it is possible to manufacture a shielding plate with dimensions larger than the standard size of a permalloy material.

Meanwhile, a strip material 18 can be formed at any time before spot welding. Further, a permalloy layer 3 and an amorphous layer 1 may be stacked and fixed before or after the spot welding.

In the present embodiment also, plate materials are stacked and fixed in the state where the surfaces of the respective materials are in direct contact with each other as described in First Embodiment. Here, when shielding performance is allowed to decline to some extent or the like, a double-sided adhesive tape or the like may be used between layers.

Although an amorphous material is not affected, when a soft magnetic material such as a PC permalloy material is deformed by external force after magnetic annealing, the magnetic permeability may decrease sometimes because transition of a metallographic structure is generated and the like. It is therefore desirable to have a structure of not adding such an external force as to cause deformation to a permalloy layer 3 including attachment and detachment work from a device during inspection and maintenance.

As an example of reinforcement aimed at preventing the deformation of a shielding plate, it is possible to use a reinforcing material that can suppress weight increase and supplement an electrostatic shielding effect on a high-frequency electric field. For example, it is appropriate to: use a corrosion-resistant aluminum material (for example, 5000-series aluminum) of a thickness in the range of 1.0 mm to 1.5 mm as a reinforcing material; and arrange it as the outermost layer of the shielding plate. An example of such a configuration is shown in FIG. 4. Such a configuration is used also for the experimental shielding model shown in FIG. 7.

If such a structure is used, a shielding plate can be used also for the structure of a single swing door by preparing a pair of upper and lower hinge parts at an end constituting a side of the reinforcing material, for example.

Further, when mechanical reinforcement is further required for preventing performance deterioration, although the weight may possibly increase relatively significantly, an austenitic stainless steel material of a SUS316 or SUS304 material about 1 mm in thickness may be arranged on the outer layer of an aluminum material. In this way, the reinforcement is further strengthened.

Fourth Embodiment

Fourth Embodiment relates to an electromagnetic field shielding structure having an electromagnetic field shielding plate according to First Embodiment. In particular, the electromagnetic field shielding structure according to Fourth Embodiment includes a structure for fixing a shielding plate detachably and attachably.

Figure 18A:
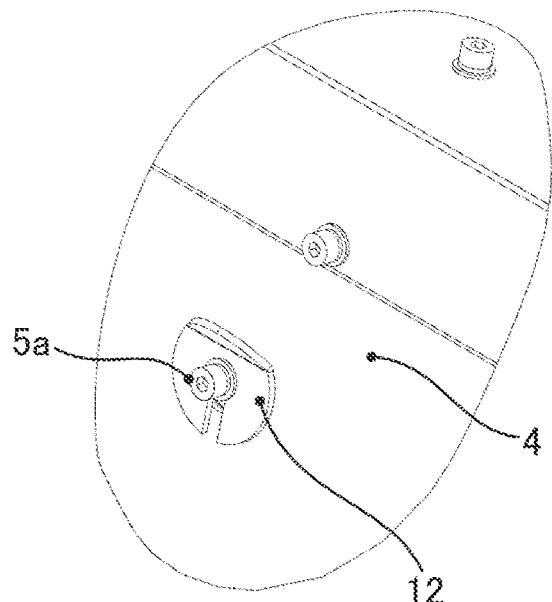
FIGS. 18A-18C are views showing an example of a configuration of an electromagnetic field shielding structure according to Fourth Embodiment of the present invention.
Figure 18B:
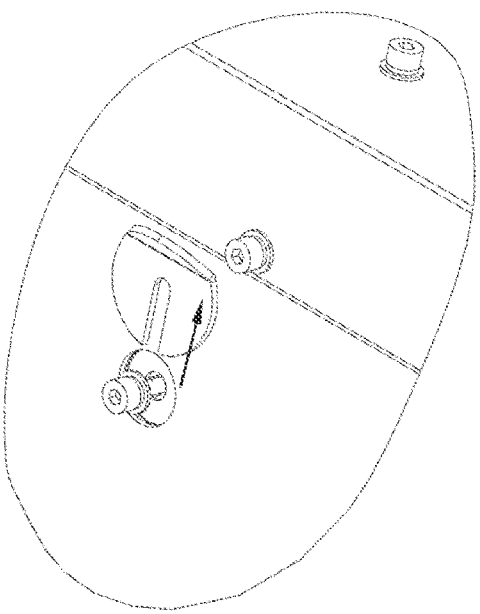
Figure 18C:
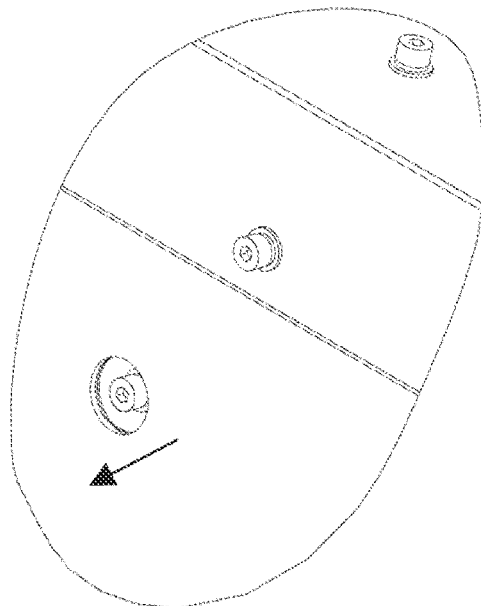
Figure 19:
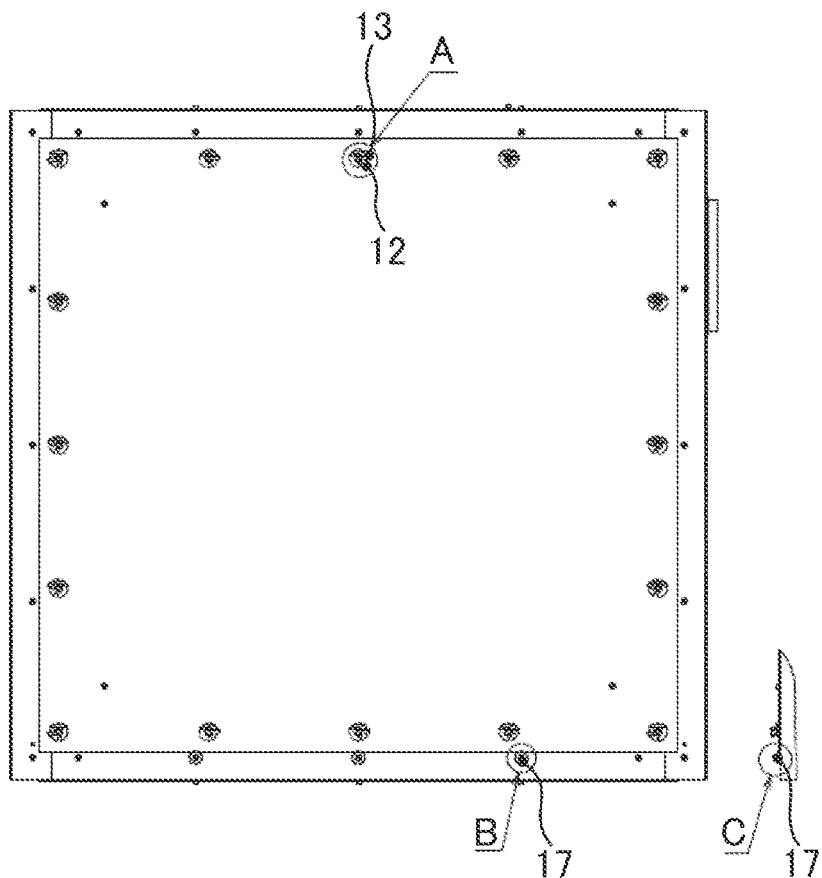
FIG. 19 is a view including an overall view of the electromagnetic field shielding structure in FIG. 18.
Figure 19:
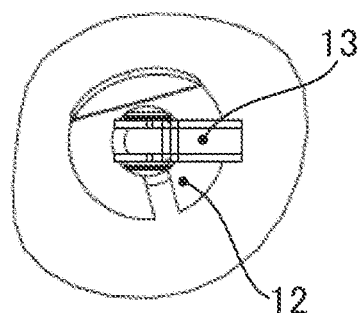
Figure 19:
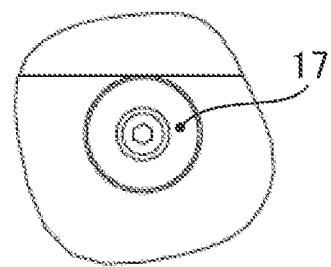
Figure 19:
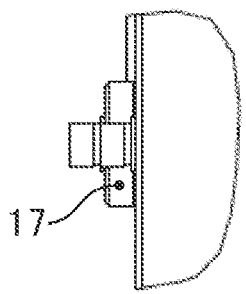

Examples of configurations of the electromagnetic field shielding structures according to Fourth Embodiment are shown in FIG. 18 and FIG. 19. FIG. 18 represents enlarged views around a fixing structure. FIG. 19 represents views including an overall view. This example relates to an electromagnetic field shielding structure of a cubic shape using a square shielding plate on each side. An opening may be prepared at least in one shielding plate.

In each shielding plate, a permalloy layer and an amorphous layer are provided with perforated holes (second through holes), respectively. Some or all of the first through holes (holes H) in First Embodiment may also function as the second through holes according to Fourth Embodiment. Further, when a shielding plate is fixed, fixing screw holes are arranged at edges of the four sides of each plane by preparing female thread elements in frame members corresponding to ridges (corners) constituting the shielding structure. For example, a frame member may be configured by using a ridge connection member of Second Embodiment.

The shielding structure according to Fourth Embodiment has a fixing member (second fixing member) to fix a shielding plate to a frame member and a washer. The fixing member has a male thread element. In the examples of FIG. 18 and FIG. 19, the second fixing member comprises a bolt 5a and the washer comprises a washer 12.

FIG. 18(a) shows the state where a bolt 5a fixes a washer 12. FIG. 18(b) shows the process of loosening the bolt 5a, releasing the washer 12 from being fixed, and then removing the washer 12. FIG. 18(c) shows the process of removing a corrosion-resistant aluminum plate material 4 after removing the washer 12.

The inner diameter of the hole in the shielding plate is configured so as to be larger than the outer diameter of the head of the bolt 5a and not to require precise positioning when the bolt 5a is placed. The washer 12 is provided with a notch having a predetermined inner diameter. The notch extends from the circumference of the washer 12 inward in the radial direction up to the center. The notch has a constant width and is formed so as to include the axis of the washer 12.

The outer diameter of the washer 12 is configured so as to be larger than the inner diameter of the hole and not to allow the washer 12 to pass through the hole. Further, the inner diameter of the washer 12 (namely, the inner diameter of the notch) is configured so as to be smaller than the outer diameter of the head of the bolt 5a and able to insert the bolt 5a through the notch of the washer 12. Further, the bolt 5a is configured so as to be able to insert the shaft (particularly a position close to the head) into the notch of the washer 12 from the outside toward the inside in the radial direction. In other words, the bolt 5a and the washer 12 are configured so that the notch of the washer 12 may be slid from the outside in the radial direction and fitted to the shaft of the bolt 5a (particularly a position close to the head).

The washer 12 is arranged on the opposite side of the amorphous layer from the permalloy layer at the hole. For example, as shown in FIG. 18, the washer 12 is arranged so as to touch a corrosion-resistant aluminum plate material 4 from outside. The male thread element of the bolt 5a: is screwed with the female thread element (for example, prepared in the ridge stainless steel layer 14) of the frame member and can tighten and fix the washer 12 (in this example, with the corrosion-resistant aluminum plate material 4 interposed) toward the amorphous layer 1 and the permalloy layer 3.

The bolt 5a can be arranged so that the contact area of the opposing surfaces of the frame member and the shielding plate may be as large as possible. The arrangement intervals of the bolts 5a can be selected in the range of about 200 mm to 250 mm, for example. More stable shielding performance can be obtained before and after the detachment and attachment of the shielding plate by using a torque driver or the like and fixing each part with a constant axial force in the fastening work of each bolt 5a.

In the example of FIG. 19, a case of using a shielding plate of 900 mm in vertical length (height) and 940 mm in horizontal length (width) is considered. As shown in FIG. 19, it is possible to arrange bolts 5a at 16 locations in total, 5 locations on each of the four sides on the top, bottom, left, and right (4 corners overlap). The shielding plate is fixed to the frame member in this way. In the experiment using the model of FIG. 7, shielding performance is measured by controlling the bolts with a nominal diameter of 4 mm (M4 bolt) with a tightening torque of 0.7 N/m. If this tightening torque is used, the axial force is about half of the yield stress of an M4 bolt and hence there is plenty of allowance for bolt breakage. The shielding plate therefore can be repeatedly detached and attached and contact between a shielding plate and a shielding plate is also ensured sufficiently.

Regarding to electromagnetic field shielding in the MHz band, it sometimes happens that a slot antenna is configured by a minute gap between shielding plates and resonance occurs. On such an occasion, a conductive foam material of about 0.5 mm to 1.0 mm may be attached to the peripheral edge of an aluminum plate of the outermost layer.

In the example of FIG. 11 for example, a conductive foam material is arranged in a gap region X between a corrosion-resistant aluminum plate material 4 in a shielding plate constituting the outermost layer and a ridge corrosion-resistant aluminum plate material 4a in a ridge connection member. It is desirable to select the thickness and width of a conductive foam material so as to be able to ensure sufficient contact between a permalloy layer 3 and a ridge permalloy layer 3a.

On the occasion of maintenance or inspection of a shielding structure, work to release the fixing with a bolt 5a and a washer 12 occurs. When the inner diameter of a hole in a shielding plate is smaller than the outer diameter of the head of a bolt 5a for example, work of repeating the work of detaching and refastening the bolt 5a for each shielding plate occurs. Work of completely detaching 12 to 16 bolts 5a per one shielding plate occurs and, when 10 or more shielding plates are arranged in the four directions of left, right, front, and back in one shielding structure for example, enormous work is generated just by detaching and attaching the shielding plates.

As shown in FIG. 18, the inner diameter of a hole prepared in a shielding plate at a bolt fixing position can be configured so as to be larger than the outer diameter of the head of a bolt 5a. In this way, precise positioning becomes unnecessary on the occasion of shielding plate fixing even when dimensional variation during plate metal forming and drilling is taken into consideration and work efficiency improves. In addition, the washer 12 is configured in the shape allowing the washer 12 to be inserted and removed by being slid from the shaft of the bolt 5a and workability for detaching and attaching a shielding plate can be improved.

With this structure, it is unnecessary to rotate each bolt until the entire shaft is pulled out. By rotating and loosening a bolt 5a to the extent of allowing a washer 12 capable of being inserted and removed to slide comfortably, it is possible to: extract the washer 12 capable of being inserted and removed; and remove a shielding plate without removing the bolt 5a.

Meanwhile, regarding to the positioning of a hole and a bolt 5a, any sort of a support structure may be prepared. As shown in FIG. 19 for example, a shielding plate support member 17 (third fixing member) may be arranged to a frame member. The shielding plate support member 17 can comprise a structure having a male thread element (bolt or the like) and a structure having a female thread element (nut, stainless steel layer, or the like), for example. The shielding plate support member 17 can be arranged so as to be able to support the lower side of a shielding plate. Firstly, a shielding plate is temporarily placed at a position to be mounted over the shielding plate support member 17. Successively, in the state, a washer 12 capable of being inserted and removed: is inserted below the head of a bolt 5a; and temporarily fixes the shielding plate. Successively, a shielding structure can be assembled by a method of fixing each bolt with a predetermined tightening torque.

Meanwhile, in an electromagnetic field shielding structure, the axis of a hole and the axis of a bolt 5a are configured so as to be conformable with each other to some extent in the state where a shielding plate support member 17 fixes a shielding plate to a frame member (for example, a stainless steel layer). For example, it is configured so that the axis of a hole may pass through a bolt 5a. In this way, the work of removing a shielding plate becomes more efficient.

Further, in Fourth Embodiment, in order to further improve workability, a bolt 13 shown in the enlarged view of the A part in FIG. 19 is used together with a bolt 5a shown in FIG. 18. The shape and action of the bolt 13 are shown in FIG. 20. The bolt 13 has a cam-type opening-and-closing mechanism including a cam lever. The cam lever is formed at the head of the bolt 13.

Figure 20A:
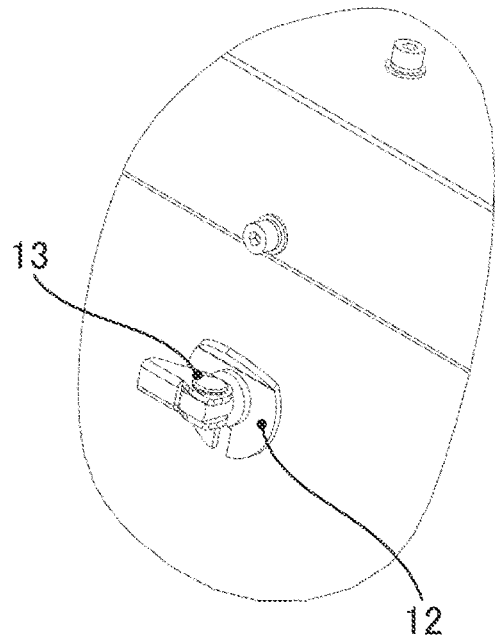
FIGS. 20A-20D are views showing the shape and action of the bolt in FIG. 19.
Figure 20B:
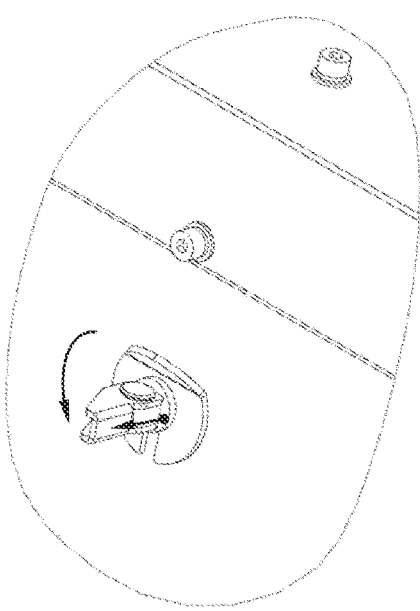
Figure 20C:
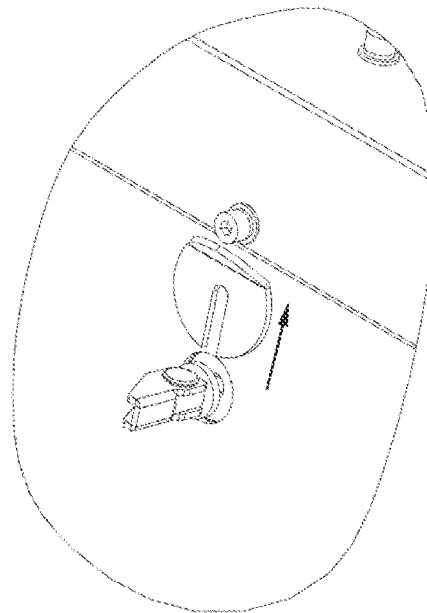

The bolt 13 and a washer 12 are configured so that the positional range in the axial direction of the washer 12 may be regulated in response to the rotational operation of the cam lever. In the case where the cam lever is in a closed position as shown in FIG. 20(a) for example, the washer 12 is pushed against a shielding plate and fixed. In contrast, in the case where the cam lever is in an opening position as shown in FIG. 20(b), the washer 12 is not pushed against the shielding plate (for example, slightly movable in the axial direction) and the washer 12 can be pulled out easily as shown in FIG. 20(c).

Figure 20D:
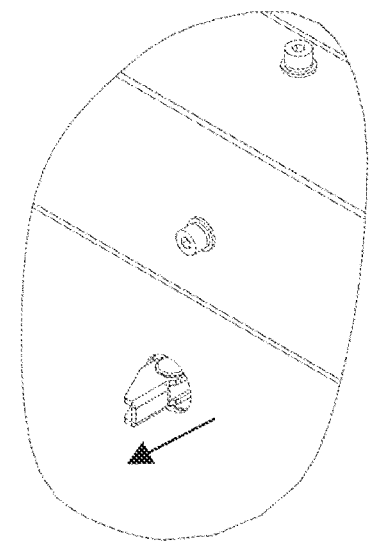

Further, in the state where the cam lever is in an opening position, it is configured so that the largest outer diameter of the bolt 13 may be smaller than the inner diameter of a hole in a shielding plate and resultantly the entire bolt 13 can pass through the hole in the shielding plate in the axial direction. After the washer 12 is pulled out therefore, as shown in FIG. 20(d), the shielding plate can be detached with the bolt 13 in place. With this structure, pressure contact is completed by tightening by the operation of the cam lever even in the fixing work when the shielding pate is attached again and hence the detaching and attaching work of the shielding plate can be further simplified.

Here, the bolt 5a and the bolt 13 in Fourth Embodiment are not necessarily used together and only either of them may be used.

Fifth Embodiment

In Fifth Embodiment, the permalloy layer 3 in Embodiments 1 to 4 is changed to a soft magnetic material layer. The meaning and range of a "soft magnetic material" can be appropriately defined by those skilled in the art and the soft magnetic material is referred to for example as a material characterized in that the coercive force is relatively small and the magnetic permeability is relatively large. Otherwise, for example, a hard magnetic material, which is an antonym for a "soft magnetic material", is referred to as a material whose magnetic poles do not easily disappear or invert, namely a material of a large coercive force and a so-called a "magnet" is included in this category. Since a permalloy material however has a very high magnetic permeability and a small coercive force, the hard magnetic material has a relatively small magnetic permeability and a relatively large coercive force when compared with the permalloy material. Difference from Embodiments 1 to 4 is explained hereunder.

Figure 21:
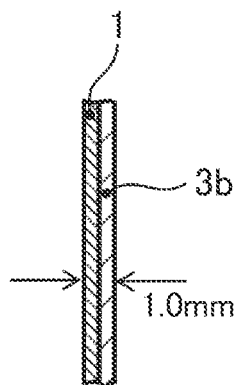
FIG. 21 is a view showing an example of a configuration of an electromagnetic field shielding plate according to Fifth Embodiment of the present invention.

An example of a configuration of an electromagnetic field shielding plate according to Fifth Embodiment is shown in FIG. 21. The electromagnetic field shielding plate according to Fifth Embodiment is configured by stacking an electromagnetic steel 3b comprising an electrical steel plate material or a sheet of a soft magnetic material and an amorphous layer 1 comprising a plate material or a sheet of Fe—Si—B—Cu—Nb-based amorphous by a mechanical means. The mechanical means is referred to as a means of tightening and fixing with a bolt for example but is not limited to that means.

The meaning and range of an "electrical steel" can be appropriately defined by those skilled in the art and the electrical steel is referred to for example as a steel material with a high conversion efficiency between electromagnetic energy and magnetic energy. Otherwise, for example the electrical steel is referred to as a steel material that allows magnetism to pass through without large resistance and has a low iron loss. Specific examples of electrical steel include pure iron, magnetic stainless steel, silicon steel, etc. A plate material comprising electrical steel is an electrical steel plate.

For an electrical steel plate material of a soft magnetic material, any material may be used as long as desired performance is obtained. For example, a non-oriented electrical steel plate (magnetic stainless steel, silicon steel plate, or the like) of a full-processed material that has finished the processing up to magnetic annealing after rolling may be adopted. Further, forming and cutting with a fiber laser machine may be applied. On this occasion, even when local characteristic change due to thermal cutting around a material cutting part occurs during outer shape forming, the magnetic performance can be almost kept in the state before processing at the other part and hence annealing process can be omitted.

When an electrical steel plate material of a soft magnetic material is used, the material cost can be reduced significantly in comparison with a permalloy material (for example, PC permalloy material), further magnetic annealing can be omitted at the manufacturing process of the plate material, hence the cost of the manufacturing process of a shielding plate is reduced, and the manufacturing process of the shielding plate is simplified. Here, the magnetic annealing cited here: is applied after a plate material is cut and formed, for example; includes predetermined heating time and cooling time, for example; and is applied at 730° C. to 1,100° C. in a non-oxidizing atmosphere, for example.

In a shielding plate according to Fifth Embodiment however, since an electrical steel plate material of a soft magnetic material is stacked on an amorphous material 1, the shielding effect by stacking the amorphous layer 1 and the electromagnetic steel 3b is obtained but, in the case where an extremely large external magnetic field is generated, even after the external magnetic field is reduced, a possibility of causing a situation where a magnetic field remains in the shielding plate is assumed. The reason is that the electrical steel plate material has a magnetic permeability smaller than the permalloy material and a coercive force larger than the permalloy material.

The thickness of an electromagnetic steel 3b can be designed arbitrarily but sufficient shielding performance can be obtained in some applications when the thickness is 0.5 mm or more and the weight can be reduced sufficiently in some applications when the thickness is 0.635 mm or less. In this way, in an embodiment, the thickness of an electromagnetic steel 3b is preferably in the range of 0.500 mm to 0.635 mm.

A shielding plate according to Fifth Embodiment and a shielding plate according to prior art are compared hereunder. Firstly, in Patent Literature 4, a shielding plate aimed at reducing a radiation electromagnetic field from a reactor for power factor improvement (coil-like component) placed under a railroad floor to the extent of not adversely affecting a device such as a pacemaker in a guest room is described.

A shielding plate in Patent Literature 4 uses a Co-based amorphous material and does not use an Fe—Si—B—Cu—Nb-based amorphous material like Fifth Embodiment. The Co-based amorphous material has the disadvantages of high cost and large deterioration of magnetism with the lapse of time.

Further, the shielding plate in Patent Literature 4 is used for rail cars and particularly attached to the exterior of a floor and hence the disadvantage is that the thickness is too heavy to be used for another application. An example of the shielding plate described in Patent Literature 4 has 25 silicon steel plates with a thickness of 0.35 mm, 5 Co-based amorphous sheets with a thickness of 0.5 mm, and 2 cover members with a thickness of 3.2 mm and has a total thickness of 17.65 mm. Further, in this example, the member has the dimensions of 1,600 mm×1,300 mm and the weight of 248 kg.

On the contrary, Fifth Embodiment of the present invention has a much smaller thickness. For example, even though a corrosion-resistant aluminum plate material 4 added with the aim of reinforcement, etc. is included, Fifth Embodiment has the corrosion-resistant aluminum plate material 4 with a thickness of 1.2 mm, an amorphous layer 1 with a thickness of 0.5 mm, and an electromagnetic steel 3b with a thickness of 0.5 mm and the total thickness stays at about 2.2 mm. Even though the range of the thickness of the electromagnetic steel 3b is taken into consideration, it is possible to design so that the combined thickness of an amorphous layer 1 and an electromagnetic steel 3b may be 1.0 mm or less, 1.1 mm or less, 1.2 mm or less, 1.3 mm or less, 1.4 mm or less, or 1.5 mm or less. Further, it is also possible to design so that the thickness of an electromagnetic steel 3b may be 1.0 mm or less, 1.1 mm or less, 1.2 mm or less, 1.3 mm or less, 1.4 mm or less, or 1.5 mm or less. The weight therefore is reduced. In this way, such a thin and light shielding plate is effective for shielding an alternating magnetic field (AC magnetic field) and an electric field at the outer periphery of semiconductor manufacturing and inspection equipment.

Further, in Patent Literature 6, a shielding plate used in the case of nuclear magnetic resonance measurement and biomagnetic measurement by applying a SQUID sensor is described. The shielding plate in Patent Literature 6 aims to suppress disturbances in the case of measuring an extremely weak magnetic field.

The shielding plate in Patent Literature 6 is formed by stacking amorphous and a ferromagnetic material and does not use a soft magnetic material with a small coercive force and a high magnetic permeability like Fifth Embodiment of the present invention.

Further, the shielding plate in Patent Literature 6 essentially requires magnetic annealing process. For example, magnetic annealing is applied after materials are stacked through cold rolling. The magnetic annealing is applied at 350° C. for 30 minutes in a DC magnetic field of 15 Oersted in a non-oxidizing atmosphere. It takes time and effort because, in this way, magnetic annealing is applied while a tuned external magnetic field is applied or in the state of an extremely small magnetic field.

On the contrary, in Fifth Embodiment of the present invention, a shielding plate can be manufactured without applying magnetic annealing process to any of the layers after the layers are formed.

Figure 22:
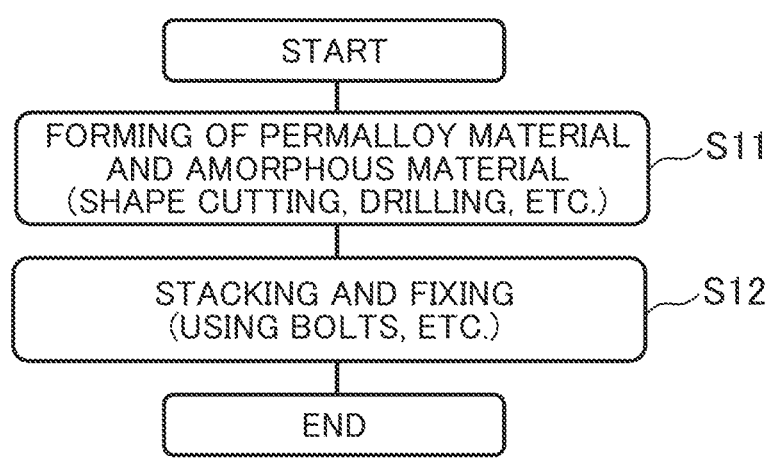
FIG. 22 is a flowchart explaining an example of a method for manufacturing the electromagnetic field shielding plate in FIG. 21.

FIG. 22 is a flowchart explaining an example of a method for manufacturing a shielding plate according to Fifth Embodiment. For example, a shielding plate can be manufactured by a method including: a process (Step S11) of forming an amorphous material and manufacturing an amorphous layer 1; a process (likewise Step S11) of forming an electrical steel material and manufacturing an electromagnetic steel 3b; and a process (Step S12) of stacking the amorphous layer 1 and the electromagnetic steel. That is, the method for manufacturing the shielding plate does not include magnetic annealing process to the electromagnetic steel 3b after the process (Step S11) of manufacturing the amorphous layer 1 and the process (likewise Step S11) of manufacturing the electromagnetic steel 3b. The manufacturing process and the structure therefore become extremely simple.

LIST OF REFERENCE SIGNS

1 amorphous layer
2 resin tape material (coating layer)
3 permalloy layer
3a ridge permalloy layer
3b electromagnetic steel
3x first permalloy layer
3y second permalloy layer
4 corrosion-resistant aluminum plate material
4a ridge corrosion-resistant aluminum plate material
5 bolt (first fixing member)
5a bolt (second fixing member)
6 reinforcing plate material (reinforcing layer)
10 honeycomb material (honeycomb structural member)
10a reinforcement
11 metal mesh (reticulated tube member)
12 washer
13 bolt (second fixing member)
14 ridge stainless steel layer
15 nut
16 female thread element
17 shielding plate support member (third fixing member)
18 strip material
19 plate material
H hole (first through hole, second through hole)

The invention claimed is:

1. An electromagnetic field shielding structure having
   a first shielding plate including an electromagnetic field shielding plate configured by stacking a permalloy layer comprising a plate material or a sheet of permalloy and an amorphous layer comprising a plate material or a sheet of Fe—Si—B—Cu—Nb-based amorphous,
   a second shielding plate including another electromagnetic field shielding plate, and
   a ridge connection member, wherein:
   the ridge connection member is configured by stacking at least a ridge permalloy layer comprising a plate material or a sheet of permalloy and a ridge stainless steel layer comprising an austenitic stainless steel material with a thickness in the range of 1.8 mm to 2.4 mm;
   the ridge connection member has a ridge forming a first angle and is provided with female thread elements on both sides of the ridge;
   at least a part on one side of the ridge of the ridge connection member and at least a part of the first shielding plate are fixed so as to overlap; and
   at least a part on the other side of the ridge of the ridge connection member and at least a part of the second shielding plate are fixed so as to overlap.

2. An electromagnetic field shielding structure having
   a first shielding plate including an electromagnetic field shielding plate configured by stacking a permalloy layer comprising a plate material or a sheet of permalloy and an amorphous layer comprising a plate material or a sheet of Fe—Si—B—Cu—Nb-based amorphous,
   a second shielding plate including another electromagnetic field shielding plate,
   a second fixing member provided with a male thread element,
   a frame member provided with a female thread element, and
   a washer, wherein:
   each of the permalloy layer and the amorphous layer is provided with a second through hole;
   the inner diameter of the second through hole is larger than the outer diameter of the head of the second fixing member;
   the outer diameter of the washer is larger than the inner diameter of the second through hole;
   the inner diameter of the washer is smaller than the outer diameter of the head of the second fixing member;
   the washer is arranged on the opposite side of the amorphous layer from the permalloy layer at the second through hole; and the male thread element of the second fixing member is screwed with the female thread element of the frame member and can tighten and fix the washer toward the amorphous layer and the permalloy layer.

3. An electromagnetic field shielding structure having an electromagnetic field shielding plate configured by stacking a permalloy layer comprising a plate material or a sheet of permalloy and an amorphous layer comprising a plate material or a sheet of Fe—Si—B—Cu—Nb-based amorphous, wherein:
the electromagnetic field shielding structure is provided with an opening for wafer transfer; and
a metal reticulated tube member having air permeability is attached to the opening for wafer transfer so as to cover the opening and adhere to the electromagnetic field shielding plate.

4. An electromagnetic field shielding structure having
a first shielding plate,
a second shielding plate, and
a ridge connection member, wherein:
each of the first shielding plate and the second shielding plate includes an electromagnetic field shielding plate and the electromagnetic field shielding plate is configured by stacking a soft magnetic material layer and an amorphous layer comprising a plate material or a sheet of Fe—Si—B—Cu—Nb-based amorphous;
the ridge connection member is an electromagnetic field shielding member comprising a magnetic material;
the ridge connection member has a ridge;
at least a part on one side of the ridge of the ridge connection member and at least a part of the first shielding plate are fixed so as to overlap; and
at least a part on the other side of the ridge of the ridge connection member and at least a part of the second shielding plate are fixed so as to overlap.

5. An electromagnetic field shielding structure according to claim 4, wherein the soft magnetic material layer includes a permalloy layer.

6. An electromagnetic field shielding structure according to claim 5, wherein the electromagnetic field shielding structure has a coating layer with which an edge or an opening of the amorphous layer is covered so as not to be exposed.

7. An electromagnetic field shielding structure according to claim 5, wherein:
the electromagnetic field shielding structure further has a first fixing member comprising a non-magnetic material;
each of the permalloy layer and the amorphous layer is provided with a first through hole; and
the first fixing member fixes the permalloy layer and the amorphous layer to each other at the first through hole.

8. An electromagnetic field shielding structure according to claim 7, wherein:
the electromagnetic field shielding structure further has a corrosion-resistant aluminum plate material with a thickness in the range of 0.1 mm to 1.5 mm;
the corrosion-resistant aluminum plate material is stacked on the opposite side of the amorphous layer from the soft magnetic material layer;
the corrosion-resistant aluminum plate material is provided with the first through hole; and
the first fixing member fixes the corrosion-resistant aluminum plate material, the soft magnetic material layer, and the amorphous layer to each other at the first through hole.

9. An electromagnetic field shielding structure according to claim 8, wherein the corrosion-resistant aluminum plate material and the amorphous layer are bonded with a tape material having adhesive layers on both sides interposed.

10. An electromagnetic field shielding structure according to claim 5, wherein the thickness of the permalloy layer is in the range of 0.500 mm to 0.635 mm.

11. An electromagnetic field shielding structure according to claim 5, wherein the permalloy layer comprises a plate material or a sheet of μ-metal.

12. An electromagnetic field shielding structure according to claim 5 further having
a second fixing member provided with a male thread element,
a frame member provided with a female thread element, and
a washer, wherein:
each of the permalloy layer and the amorphous layer is provided with a second through hole;
the inner diameter of the second through hole is larger than the outer diameter of the head of the second fixing member;
the outer diameter of the washer is larger than the inner diameter of the second through hole;
the inner diameter of the washer is smaller than the outer diameter of the head of the second fixing member;
the washer is arranged on the opposite side of the amorphous layer from the permalloy layer at the second through hole; and
the male thread element of the second fixing member is screwed with the female thread element of the frame member and can tighten and fix the washer toward the amorphous layer and the permalloy layer.

13. An electromagnetic field shielding structure according to claim 12, wherein:
the second fixing member has a cam lever; and
the second fixing member and the washer are configured so that the positional range in the axial direction of the washer may be regulated in response to the rotational operation of the cam lever.

14. An electromagnetic field shielding structure according to claim 12, wherein the electromagnetic field shielding structure is configured so that the axis of the second through hole may pass through the second fixing member in the state where a third fixing member fixes the electromagnetic field shielding plate to the frame member.

15. An electromagnetic field shielding structure according to claim 4, wherein the soft magnetic material layer includes an electromagnetic steel.

16. An electromagnetic field shielding structure according to claim 15, wherein the thickness of the electromagnetic steel is 1.5 mm or less.

17. A manufacturing method of an electromagnetic field shielding structure according to claim 15, wherein:
the manufacturing method has
a method for manufacturing a first shielding plate, and
a method for manufacturing a second shielding plate;
each of the method for manufacturing the first shielding plate and the method for manufacturing the second shielding plate includes the steps of
forming an amorphous material and manufacturing the amorphous layer,
forming an electrical steel material and manufacturing the electromagnetic steel, and
stacking the amorphous layer and the electromagnetic steel; and the manufacturing method does not include magnetic annealing process to the electromagnetic steel after the steps of manufacturing the amorphous layer and manufacturing the electromagnetic steel.

18. An electromagnetic field shielding structure according to claim 4, wherein the soft magnetic material layer and the amorphous layer come in contact with each other in an entire electromagnetic field shielding region.

19. An electromagnetic field shielding structure according to claim 4, wherein the ridge connection member and the first shielding plate and the second shielding plate are fixed detachably and attachably.

20. An electromagnetic field shielding structure according to claim 4, wherein the electromagnetic field shielding structure further has a reinforcing layer comprising a reinforcing material.

21. An electromagnetic field shielding structure for a charged particle beam device including an electromagnetic field shielding structure according to claim 4.

22. An electromagnetic field shielding structure for a scanning electron microscope including an electromagnetic field shielding structure according to claim 4.

23. A semiconductor manufacturing environment having:
an electromagnetic field shielding structure according to claim 4; and
semiconductor manufacturing-related equipment driven by an AC power supply with a frequency of 50 Hz or higher.

24. An electromagnetic field shielding structure according to claim 4, wherein:
the electromagnetic field shielding structure is provided with an opening for heat dissipation; and
a plate material of a soft magnetic material provided with many holes is attached to the opening for heat dissipation.

25. An electromagnetic field shielding structure according to claim 4, wherein:
the electromagnetic field shielding structure is provided with an opening for heat dissipation; and
a honeycomb structural member of an aluminum base material is attached to the opening for heat dissipation and the honeycomb structural member has a reinforcement comprising a plate metal member on the outer circumference.

26. An electromagnetic field shielding structure according to claim 4, wherein:
the electromagnetic field shielding structure is provided with an opening for wafer transfer; and
a metal reticulated tube member having air permeability is attached to the opening for wafer transfer so as to cover the opening and adhere to the electromagnetic field shielding plate.

27. An electromagnetic field shielding structure having
a first shielding plate
a second shielding plate, and
a ridge connection member, wherein:
each of the first shielding plate and the second shielding plate includes an electromagnetic field shielding plate and the electromagnetic field shielding plate is configured by stacking a soft magnetic material layer and an amorphous layer comprising a plate material or a sheet of Fe—Si—B—Cu—Nb-based amorphous;
the ridge connection member is an electromagnetic field shielding member comprising a magnetic material;
the ridge connection member has a ridge;
at least a part on one side of the ridge of the ridge connection member and at least a part of the first shielding plate are fixed so as to overlap;
at least a part on the other side of the ridge of the ridge connection member and at least a part of the second shielding plate are fixed so as to overlap;
the electromagnetic field shielding structure has a coating layer with which an edge or an opening of the amorphous layer is covered so as not to be exposed; and
the ridge connection member and the first shielding plate and the second shielding plate are fixed detachably and attachably.

* * * * *